(12) United States Patent
Taniguchi et al.

(10) Patent No.: US 7,601,581 B2
(45) Date of Patent: Oct. 13, 2009

(54) METHOD OF MANUFACTURING A SEMICONDUCTOR DEVICE

(75) Inventors: Yasuhiro Taniguchi, Tokyo (JP); Kazuyoshi Shiba, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 454 days.

(21) Appl. No.: 11/649,759

(22) Filed: Jan. 5, 2007

(65) Prior Publication Data
US 2007/0207575 A1    Sep. 6, 2007

(30) Foreign Application Priority Data
Mar. 1, 2006    (JP) .............................. 2006-054637

(51) Int. Cl.
*H01L 21/8238*    (2006.01)
(52) U.S. Cl. ............................... 438/201; 257/E21.689
(58) Field of Classification Search ................ 438/201, 438/211; 257/E21.689
See application file for complete search history.

(56) References Cited

U.S. PATENT DOCUMENTS 6,482,698 B2 * 11/2002 Peschiaroli et al. ......... 438/257
6,534,363 B2 * 3/2003 Kim ........................... 438/258
6,569,742 B1 * 5/2003 Taniguchi et al. ........... 438/303

FOREIGN PATENT DOCUMENTS

JP    2004-40041 A    2/2004

* cited by examiner

*Primary Examiner*—Chandra Chaudhari
(74) *Attorney, Agent, or Firm*—Miles & Stockbridge P.C.

(57) ABSTRACT

Provided is a manufacturing method of a semiconductor device, which comprises forming a film stack of a gate insulating film, a charge storage film, insulating film, polysilicon film, silicon oxide film, silicon nitride film and cap insulating film over a semiconductor substrate; removing the film stack by photolithography and etching from a low breakdown voltage MISFET formation region and a high breakdown voltage MISFET formation region; forming gate insulating films, polysilicon film and cap insulating film over the semiconductor substrate, forming a gate electrode in the low breakdown voltage MISFET formation region and high breakdown voltage MISFET formation region, and then forming a gate electrode in a memory cell formation region. By the manufacturing technology of a semiconductor device for forming the gate electrodes of a first MISFET and a second MISFET in different steps, the present invention makes it possible to provide the first MISFET and the second MISFET each having improved reliability.

21 Claims, 38 Drawing Sheets n-CHANNEL MISFET FORMATION REGION | BOUNDARY REGION | p-CHANNEL MISFET FORMATION REGION

METHOD OF MANUFACTURING A SEMICONDUCTOR DEVICE

CROSS-REFERENCE TO RELATED APPLICATION

The present application claims priority from Japanese patent application No. 2006-54637 filed on Mar. 1, 2006, the content of which is hereby incorporated by reference into this application.

BACKGROUND OF THE INVENTION

The present invention relates to a manufacturing technology of a semiconductor device, particularly to a technology effective when applied to the manufacture of the gate electrode of a first MISFET and the gate electrode of a second MISFET by different steps.

In Japanese Unexamined Patent Publication No. 2004-40041, disclosed is a technology of forming, over one semiconductor substrate, both a low-voltage transistor which operates at a low voltage and a flash memory which operates at a high voltage and has a two-layer electrode structure called ETOX.

Described specifically, both a field oxide film for element isolation and a protection oxide film for ion implantation are formed over a semiconductor substrate in order to form a low-voltage transistor region and a flash memory region. After the formation, by lithography, of a first resist pattern in which only the low-voltage transistor region is opened, ion implantation for controlling the threshold voltage of the low-voltage transistor is carried out. The first resist pattern is removed and lithography is then performed again to form a second resist pattern in which only the flash memory region is opened. The protection oxide film is removed only from the flash memory region by etching.

After removal of the second resist pattern, a gate oxide film of the flash memory is formed and then a first-level gate electrode material is formed over the flash memory region. The protection oxide film is removed by etching from the low voltage transistor region, whereby a gate oxide film of the low voltage transistor is formed. Simultaneously with this, an interlayer insulating film of the flash memory is formed. After formation of a second-level gate electrode material, lithography and etching are performed to form a gate electrode of the low-voltage transistor and a gate electrode of the flash memory.

SUMMARY OF THE INVENTION

An electrically programmable nonvolatile semiconductor memory device (semiconductor device) can perform on-board program rewriting so that the development period of a program can be shortened and the development efficiency can be improved. In addition, the memory device has expanded its applications, for example, to the high-mix low-volume production and tuning for each destination. Particularly, in recent years, there has been an increasing need for microcomputers having an EEPROM (Electrically Erasable Programmable Read Only Memory) mounted thereon.

As an electrically programmable nonvolatile semiconductor memory device, an EEPROM having a polysilicon film as a charge storage film has been used mainly.

The EEPROM having a polysilicon film as a charge storage film has, however, a problem that since the charge storage film is a conductor, a defect in only a portion of an oxide film encompassing the polysilicon film leads to abnormal leakage and all the electrons accumulated in the charge storage film are escaped from the charge storage film. Particularly, with a further reduction in size and increase in the integration degree in future, the above-described problem is presumed to be more prominent.

An MNOS (Metal Nitride Oxide Semiconductor) structure and MONOS (Metal Oxide Nitride Oxide Semiconductor) structure using not a polysilicon film but a silicon nitride film ($Si_3N_4$) as a charge storage film are proposed. In this case, electrons are stored in discrete trap levels of the nitride film serving as an insulator so that even if a defect occurs in a portion of the charge storage film and abnormal leakage occurs, all of the electrons stored in the charge storage film do not escape. Thus, the reliability of data retention can be improved.

The nonvolatile semiconductor memory device as described above is equipped with a memory cell array in which a plurality of memory cells having an MONOS structure have been arranged two-dimensionally and a peripheral circuit for driving this memory cell array. The peripheral circuit includes a high breakdown voltage MISFET (Metal Insulator Semiconductor Field Effect Transistor) which has a relatively high breakdown voltage and a low breakdown voltage MISFET which has a relatively low breakdown voltage. The high breakdown voltage MISFET is used as a decoder or booster circuit. These memory cells, high breakdown voltage MISFET and low breakdown voltage MISFET are formed over one semiconductor substrate. In other words, an MONOS transistor (a kind of MISFET) constituting the memory cell and an MISFET constituting the peripheral circuit are formed over one semiconductor substrate. When they are formed, the gate electrode of the MONOS transistor and the gate electrode of the MISFET for the peripheral circuit are formed in different steps. A step of forming the gate electrode of the MONOS transistor constituting the memory cell and the gate electrode of the MISFETs constituting the peripheral circuit will next be described referring to some diagrams. A low breakdown voltage MISFET and a high breakdown voltage MISFET constitute the peripheral circuit, but in the below diagrams used for the description, the low break down voltage MISFET is illustrated as an example of the MISFETs constituting the peripheral circuit.

There are two technologies. First one is to form the gate electrode of the MONOS transistor first and then, the gate electrode of the MISFET constituting the peripheral circuit.

As illustrated in FIG. 38, a gate insulating film 201 is formed over a semiconductor substrate 200 including a memory cell formation region and a peripheral circuit formation region, for example, by thermal oxidation. A charge storage film 202 is formed over the gate insulating film 201, for example, by CVD (Chemical Vapor Deposition). A potential barrier film 203 is then formed, for example, by CVD, followed by the formation of a polysilicon film 204 over the potential barrier film 203, for example, by CVD. The gate insulating film 201 and potential barrier film 203 are made of, for example, a silicon oxide film, while the charge storage film 202 is made of, for example, a silicon nitride film.

As illustrated in FIG. 39, a gate electrode 205 of the MONOS transistor is formed in the memory cell formation region by using photolithography and etching. At this time, the gate insulating film (first potential barrier film) 201, charge storage film 202 and potential barrier film (second potential barrier film) 203 have already been formed between the gate electrode 205 and the semiconductor substrate 200. As illustrated in FIG. 40, a gate insulating film 206 is then formed, for example, by thermal oxidation over the semiconductor substrate 200 having thereover the gate electrode 205 and a polysilicon film 207 is then formed over the gate insulating film 206.

The polysilicon film 207 and gate insulating film 206 are processed by photolithography and etching to form a gate electrode 208 of the MISFET in the peripheral circuit formation region as illustrated in FIG. 41. Between the gate electrode 208 and semiconductor substrate 200, the gate insulating film 206 is formed. As illustrated in FIG. 41, an etching residue 209 remains on the side walls of the gate electrode 205 of the MONOS transistor.

As illustrated in FIG. 42, a resist pattern 210 is formed. The resist pattern 210 is patterned to cover the peripheral circuit formation region and expose the memory cell formation region. By etching with the resist pattern 210 as a mask, the etching residue 209 formed on the side walls of the gate electrode 205 is removed. As illustrated in FIG. 43, by the removal of the resist pattern 210, the gate electrode 205 of the MONOS transistor can be formed in the memory cell formation region and the gate electrode 208 of the MISFET can be formed in the peripheral circuit formation region.

The first technology however has the following problems. As illustrated in FIG. 40, after the formation of the gate electrode 205 of the MONOS transistor in the memory cell formation region, the gate insulating film 206 is formed over the entire surface of the semiconductor substrate 200. By this step, the polysilicon film constituting the gate electrode 205 is oxidized. Oxidation proceeds particularly at the end portion of the side walls of the gate electrode 205 which is a region near the boundary adjacent to the potential barrier film 203 and a bird's beak is formed at the end portion of the gate electrode 205. Another bird's beak appears at a position of the semiconductor substrate 200 in contact with the gate insulating film 201 and it increases the thickness of the gate insulating film 201 at the end portion. The gate insulating film 201 functions as a tunnel insulating film when electrons are injected into or ejected from the charge storage film 202. The thickening of the gate insulating film 201 by the formation of the bird's beak therefore disturbs occurrence of a tunnel phenomenon, making it difficult to inject electrons into or eject electrons from the charge storage film 202. This retards the data writing or erasing and finally deteriorates the characteristics of the MONOS transistor. For example, when a bird's beak appears in the gate insulating film 201 which will be a tunnel insulating film, the gate insulating film 201 becomes thick in a region where the bird's beak has appeared, which disturbs smooth erasing of data. Then, a threshold voltage does not reduce to a predetermined level by erasing operation and a read current decreases by the repetition of rewriting. In addition to this problem, when the gate electrode 205 is downsized, a percentage of a bird's beak region in the gate electrode 205 increases, which deteriorates the thickness controllability of the gate insulating film 201. This leads to a reduction in read current or deterioration in short channel characteristics.

In the first technology, the etching residue 209 remains on the side walls of the gate electrode 205 as illustrated in FIG. 41 so that the etching residue 209 must be removed. The etching residue 209 is removed, for example, by dry etching, but there is a fear of this dry etching causing an etching damage at the end portion of the gate electrode 205. In order to alleviate the etching damage, a light oxidation step for oxidizing the surface of the gate electrode 205 in advance becomes necessary and this facilitates the formation of a bird's beak at the end portion of the gate insulating film 201.

The above-described problems thus occur when the gate electrode 205 of the MONOS transistor is formed prior to the formation of the gate electrode 208 of the MISFET constituting the peripheral circuit. A second technology is a technology of forming the gate electrode of the MISFET constituting the peripheral circuit, followed by the formation of the gate electrode of the MONOS transistor. This technology will next be described referring to some diagrams.

As illustrated in FIG. 44, a gate insulating film 301 made of a silicon oxide film is formed over a semiconductor substrate 300 including a memory cell formation region and a peripheral circuit formation region, for example, by thermal oxidation. A polysilicon film 302 is formed over the gate insulating film 301, for example, by CVD (Chemical Vapor Deposition).

As illustrated in FIG. 45, the polysilicon film 302 is processed by photolithography and etching to form a gate electrode 303 in the peripheral circuit formation region.

As illustrated in FIG. 46, a gate insulating film 304, a charge storage film 305 and a potential barrier film 306 are formed over the entire surface of the semiconductor substrate 300 having the gate electrode 303 formed thereover. A polysilicon film 307 is then formed over the potential barrier film 306. As illustrated in FIG. 47, a gate electrode 308 is formed in the memory cell formation region by photolithography and etching. At this time, an etching residue 309 remains on the side walls of the gate electrode 303 formed in the peripheral circuit formation region.

As illustrated in FIG. 48, a resist pattern 310 is formed. This resist pattern 310 is patterned to cover the memory cell formation region and expose the peripheral circuit formation region. By etching with this resist pattern 310 as a mask, the etching residue 309 formed on the side walls of the gate electrode 303 is removed. As illustrated in FIG. 49, the resist pattern 310 is removed, whereby the gate electrode 308 is formed in the memory cell formation region, while the gate electrode 303 is formed in the peripheral circuit formation region.

According to this second technology, the gate electrode 308 of the MONOS transistor is formed after the gate electrode 303 of the MISFET for the peripheral circuit. During the formation for the gate insulating film 301 for the peripheral circuit, the gate insulating film 304 of the MONOS transistor is therefore not oxidized and no bird's beak appears in the MONOS transistor.

The formation of the gate electrode 303 of the MISFET for the peripheral circuit prior to the gate electrode 308 of the MONOS transistor however causes the following problems.

As illustrated in FIG. 46, after formation of the gate electrode 303 of the MISFET in the peripheral circuit formation region, the gate insulating film 304 is formed over the entire surface of the semiconductor substrate 300. During the formation of the gate insulating film 304, the end portion of the gate electrode 303 is oxidized and a bird's beak appears at the end portion of the gate insulating film 301. The formation of the bird's beak at the end portion of the gate insulating film 301 increases the thickness of the gate insulating film 301 at the end portion thereof. The increase in the thickness of the gate insulating film 301 at the end portion thereof decreases a current flowing between a source region and a drain region of the MISFET for the peripheral circuit. In short, the magnitude of this current is inversely proportional to the thickness of the gate insulating film 301. When the gate insulating film 301 becomes thick, a current flowing between the source and drain regions cannot be secured and the characteristics of the MISFET for the peripheral circuit deteriorates. Moreover, when the MISFET for the peripheral circuit (particularly, low breakdown voltage MISFET) is downsized, the gate length of the gate electrode 303 becomes short and short channel characteristics leading to a reduction in threshold voltage becomes prominent. The short channel characteristics are improved as the gate insulating film 30 is thinner. However, when the thickness of the gate insulating film 301 is increased by the formation of a bird's beak, the short channel characteristics become more prominent and the MISFET for the peripheral circuit has deteriorated characteristics.

In the second technology, as illustrated in FIG. 47, the etching residue 309 remains on the side walls of the gate electrode 303 so that this etching residue 309 must be removed. The etching residue 309 is removed, for example, by dry etching. This dry etching, however, may cause an etching damage at the end portion of the gate electrode 303.

Moreover, in the second technology, as illustrated in FIG. 45, a silicon oxide film of about 3 nm is used as the gate insulating film 301 of the MISFET for the peripheral circuit (low breakdown voltage MISFET). In the peripheral circuit formation region (low breakdown voltage MISFET formation region) after the gate electrode 303 is formed by processing, only a silicon oxide film having a thickness less than 3 nm remains (not illustrated in FIG. 45). As illustrated in FIG. 47, the polysilicon film 307, potential barrier film 306, charge storage film 305 and gate insulating film 304 remaining in the peripheral circuit formation region are removed at the time of forming the gate electrode 308 of the MONOS transistor by processing. During the removal of this charge storage film 305 made of a silicon nitride film, a silicon oxide film (combination of the silicon oxide film of less than 3 nm thick and the gate insulating film 304) existing below the charge storage film 305 is so thin that the edge of the gate electrode 303 is exposed to hot phosphoric acid used for the removal of the silicon nitride film. This may cause an increase in the density of gate defects and faults due to undesired etching of the semiconductor substrate 300.

As described above, even if either one of the first technology or second technology is employed, the gate electrode formed first, between the two electrodes, inevitably has a problem.

An object of the present invention is to provide, in a manufacturing technology of a semiconductor device which involves forming a gate electrode of a first MISFET and a gate electrode of a second MISFET in different steps, a technology capable of improving the reliability of each of the first MISFET and second MISFET.

The above-described and other objects and novel features of the present invention will be apparent from the description herein and accompanying drawings.

Outline of the typical invention, of those disclosed by the present application, will next be described briefly.

The present invention pertains to a manufacturing method of a semiconductor device by forming a first MISFET over a first region of a semiconductor substrate and forming a second MISFET over a second region of the semiconductor substrate. The method comprises the steps of: (a) forming a first insulating film over the semiconductor substrate including the first region and the second region, (b) forming a first conductor film over the first insulating film, and (c) removing the first conductor film and the first insulating film formed over the second region. The method further comprises the steps of: (d) after the step (c), forming a second insulating film over the semiconductor substrate including the second region and the first conductor film including the first region, (e) forming a second conductor film over the second insulating film, and (f) patterning the second conductor film and the second insulating film to form a second gate electrode of the second MISFET in the second region. The method further comprises the step of: (g) after the step (f), patterning the first conductor film and the first insulating film formed in the first region to form a first gate electrode of the first MISFET in the first region.

An advantage available by the typical invention, of those disclosed by the present application, will next be described.

Prior to the formation of the first gate electrode of the first MISFET and the second gate electrode of the second MISFET by processing, respective conductor films for the formation of a first gate electrode and a second gate electrode are formed. Processing for the formation of the first gate electrode and second gate electrode is carried out after formation of these conductor films so that the reliability of the first MISFET and the second MISFET can be improved.

DETAILED DESCRIPTION OF THE INVENTION

Figure 1:
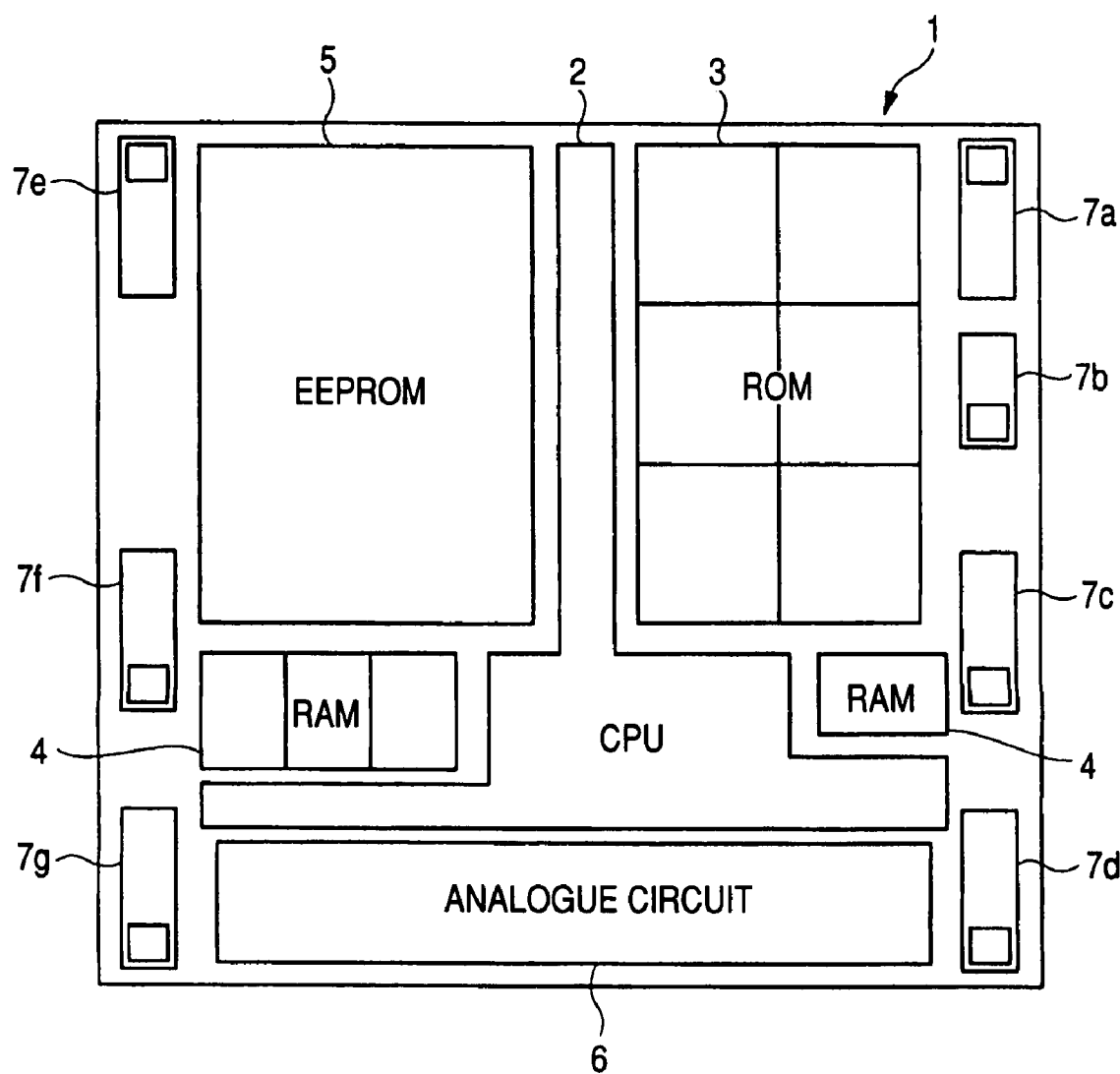
FIG. 1 is a top view illustrating the layout constitution of elements formed over a chip in Embodiment 1 of the present invention.

In the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated.

In the below-described embodiments, when a reference is made to the number of elements (including the number, value, amount and range), the number of elements is not limited to a specific number but can be greater than or less than the specific number unless otherwise specifically indicated or in the case it is principally apparent that the number is limited to the specific number.

Moreover in the below-described embodiments, it is needless to say that the constituting elements (including element steps) are not always essential unless otherwise specifically indicated or in the case where it is principally apparent that they are essential.

Similarly, in the below-described embodiments, when a reference is made to the shape or positional relationship of the constituting elements, that substantially analogous or similar to it is also embraced unless otherwise specifically indicated or in the case where it is utterly different in principle. This also applies to the above-described value and range.

In all of the drawings for illustrating the embodiments, the same members are identified by like reference numerals, and overlapping descriptions will be omitted.

The embodiments of the present invention will hereinafter be described more specifically based on accompanying drawings.

Embodiment 1

In Embodiment 1, the present invention is applied to a semiconductor device equipped with a low breakdown voltage MISFET (Metal Insulator Semiconductor) which is driven at a relatively low voltage and a high breakdown voltage MISFET which is driven at a relatively high voltage to enable high-voltage operation and having a programmable nonvolatile memory; and a manufacturing method thereof. In the MISFET, the term "breakdown voltage" means a pn junction breakdown voltage which will be generated at the boundary between a source region and a semiconductor substrate (well) or between a drain region and the semiconductor substrate (well) constituting the MISFET, or a withstand voltage of a gate insulating film. In Embodiment 1, a high breakdown voltage MISFET having a relatively high breakdown voltage and a low breakdown voltage MISFET having a relatively low breakdown voltage are formed over one semiconductor substrate.

The constitution of the semiconductor device in this Embodiment will next be described with reference to FIGS. 1 to 3.

FIG. 1 is a top view illustrating the layout constitution of elements formed over a chip (semiconductor substrate) 1. In FIG. 1, the chip 1 has a CPU (Central Processing Unit) 2, ROM (Read Only Memory) 3, RAM (Random Access Memory) 4, EEPROM (Electrically Erasable Programmable Read Only Memory) 5, analogue circuit 6, and electrostatic protection circuits 7a to 7g.

The CPU (circuit) 2 is also called a central processing unit and is the heart of a computer. This CPU 2 reads instructions from a memory device, and based on them, a variety of operations or controls are performed. It is required to have high-speed processing properties. An MISFET constituting the CPU 2 needs, among the elements formed over the chip 1, a relatively high current driving force. In other words, it is composed of a low breakdown voltage MISFET.

The ROM (circuit) 3 is a memory which stores data in the permanent form with no ability to alter the stored data. It is called a read only memory. The ROM 3 has two types of constitution, that is, an NAND type in which MISFETs are connected in series and an NOR type in which MISFETs are connected in parallel. The NAND type and NOR type are often used when a high degree of integration is required and when a high operation speed is required, respectively. The ROM 3 is also required to have high speed in operation so that MISFETs constituting the ROM 3 must have a relatively high current driving force. In other words, the ROM 3 is composed of a low voltage MISFET.

The RAM (circuit) 4 is a memory capable of reading the stored data at random, which means reading the stored data at any time, or writing the stored data newly. It is also called a random access memory. The RAM as an IC memory has two types, that is, a DRAM (Dynamic RAM) using a dynamic circuit and a SRAM (Static RAM) using a static circuit. The DRAM is a random access memory which needs a memory retaining operation, while the SRAM is a random access memory which does not need a memory retaining operation. Since the RAM 4 needs a high speed operation, the MISFETs constituting the RAM 4 are required to have a relatively high current driving force. In other words, it is composed of a low breakdown voltage MISFET.

The EEPROM 5 is a kind of a nonvolatile memory capable of electrically rewriting both write operation and erase operation. It is also called an electrically erasable programmable read only memory. The memory cell of this EEPROM 5 is composed of a transistor for memory such as MONOS (Metal Oxide Nitride Oxide Semiconductor) transistor or MNOS (Metal Nitride Oxide Semiconductor) transistor. The EEPROM 5 makes use of, for example, the Fowler-Nordheim tunneling phenomenon for its write operation and erase operation. It can also make use of hot electrons or hot holes for its write operation or erase operation.

When the EEPROM 5 performs write operation, a high potential difference (about 12V) is produced in the MONOS transistor for memory so that a transistor having a relatively high breakdown voltage is necessary as the MONOS transistor for memory.

The analog circuit 6 is a circuit handling signals of a voltage or current which show a continuous time-dependent change, that is, analog signals. It is composed of, for example, an amplification circuit, conversion circuit, modulation circuit, oscillation circuit and power supply circuit. Among the elements formed over the chip 1, a high breakdown voltage MISFET which has a relatively high breakdown voltage is used for the analog circuit 6.

The electrostatic protection circuits 7a to 7g are circuits installed on an external terminal in order to prevent the destruction of internal circuits which will otherwise be caused by a voltage or heat generated by the emission of electrification charges from the elements or insulating films. Examples of the electrification charges include electrostatic charges accumulated in the human body or object. The electrostatic protection circuits 7a and 7c are installed on an input/output terminal, while the electrostatic protection circuit 7b is installed on a monitor terminal. The electrostatic protection circuit 7d is installed on a Vss terminal, while the electrostatic protection circuit 7e is installed on a CLK (clock) terminal. The electrostatic protection circuit 7f is installed on an RST (reset) terminal, while the electrostatic protection circuit 7g is installed on a Vcc terminal. Since a high voltage is applied to these electrostatic protection circuits 7a and 7c to 7g, a high breakdown voltage MISFET having a relatively high breakdown voltage, among the elements formed over the chip 1, is employed for them.

Figure 2:
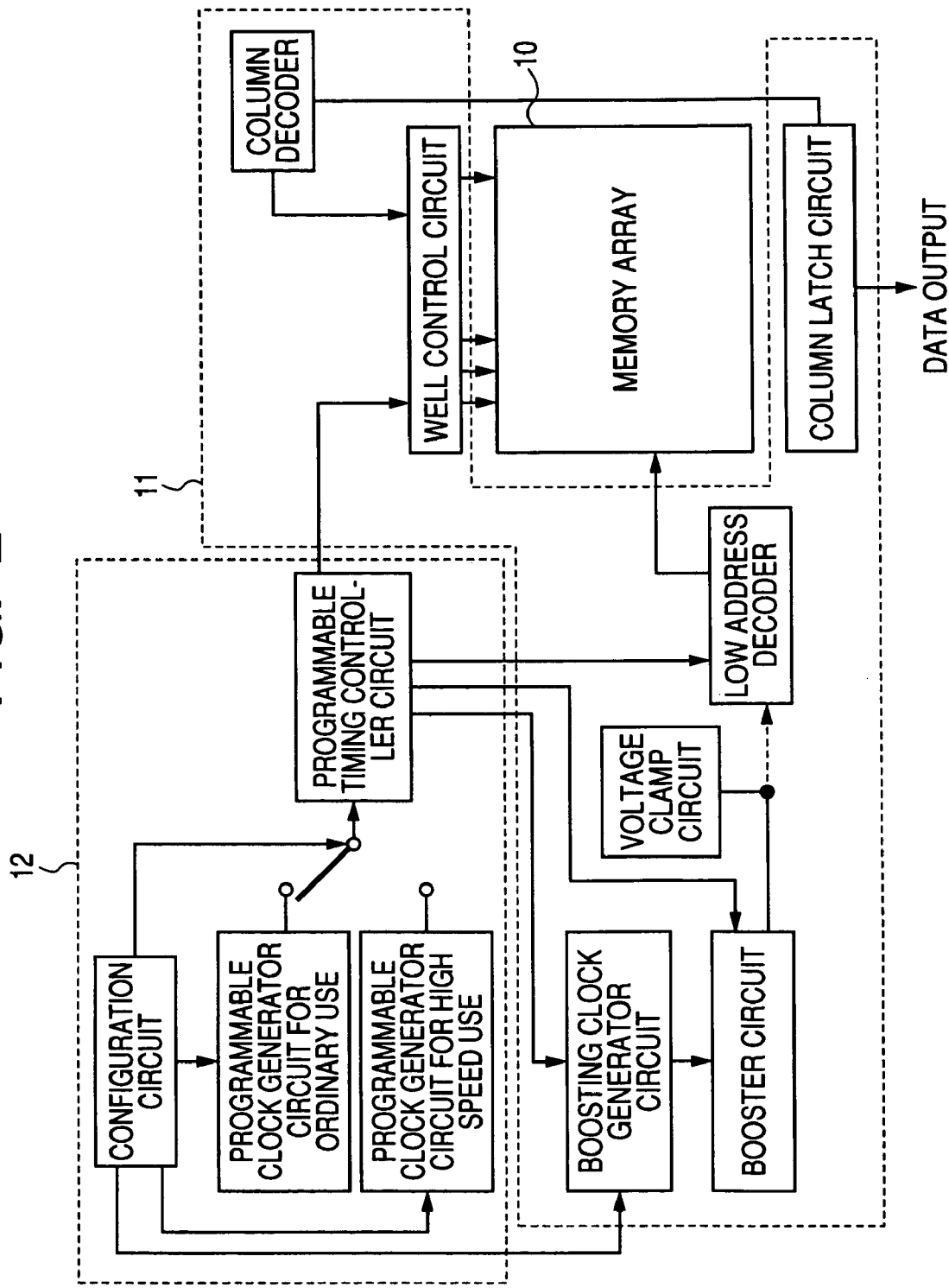
FIG. 2 is a block diagram illustrating one example of the internal constitution of the EEPROM illustrated in FIG. 1.

One example of the internal constitution of the EEPROM 5 of FIG. 1 is illustrated in FIG. 2. In FIG. 2, the EEPROM 5 has a memory array 10 and has, as a drive circuit for driving the memory array, a direct peripheral circuit unit 11 and an indirect peripheral circuit unit 12 for the memory array 10.

The memory array 10 is a memory portion of the EEPROM 5, and it has a number of memory cells arranged in a two-dimensional matrix form. A memory cell is a circuit for storing 1 bit as a unit of information, and it is composed of an MONOS transistor which is a memory portion.

The drive circuit is a circuit for driving the memory array 10 and it has, as the direct peripheral circuit unit 11, a booster circuit for boosting the level of voltage from a power supply by several times, a clock generator circuit for boosting, a voltage clamp circuit, a column decoder or row decoder for selecting a row or column, a column latch circuit and a WELL control circuit. The MISFETs constituting the direct peripheral circuit unit 11 are each made of a high breakdown voltage MISFET, which requires a relatively high breakdown voltage among elements formed over the chip 1.

The indirect peripheral circuit unit 12 is formed as a programmable controller circuit of the memory array, and it has a configuration circuit, a programmable clock generator circuit for ordinary use, a programmable clock generator circuit for high speed use, and a programmable timing controller circuit. The indirect peripheral circuit unit 12 is composed of low voltage MISFETs which can be driven at a relatively low voltage and can be operated at high speed among the elements formed over the chip 1.

Figure 3:
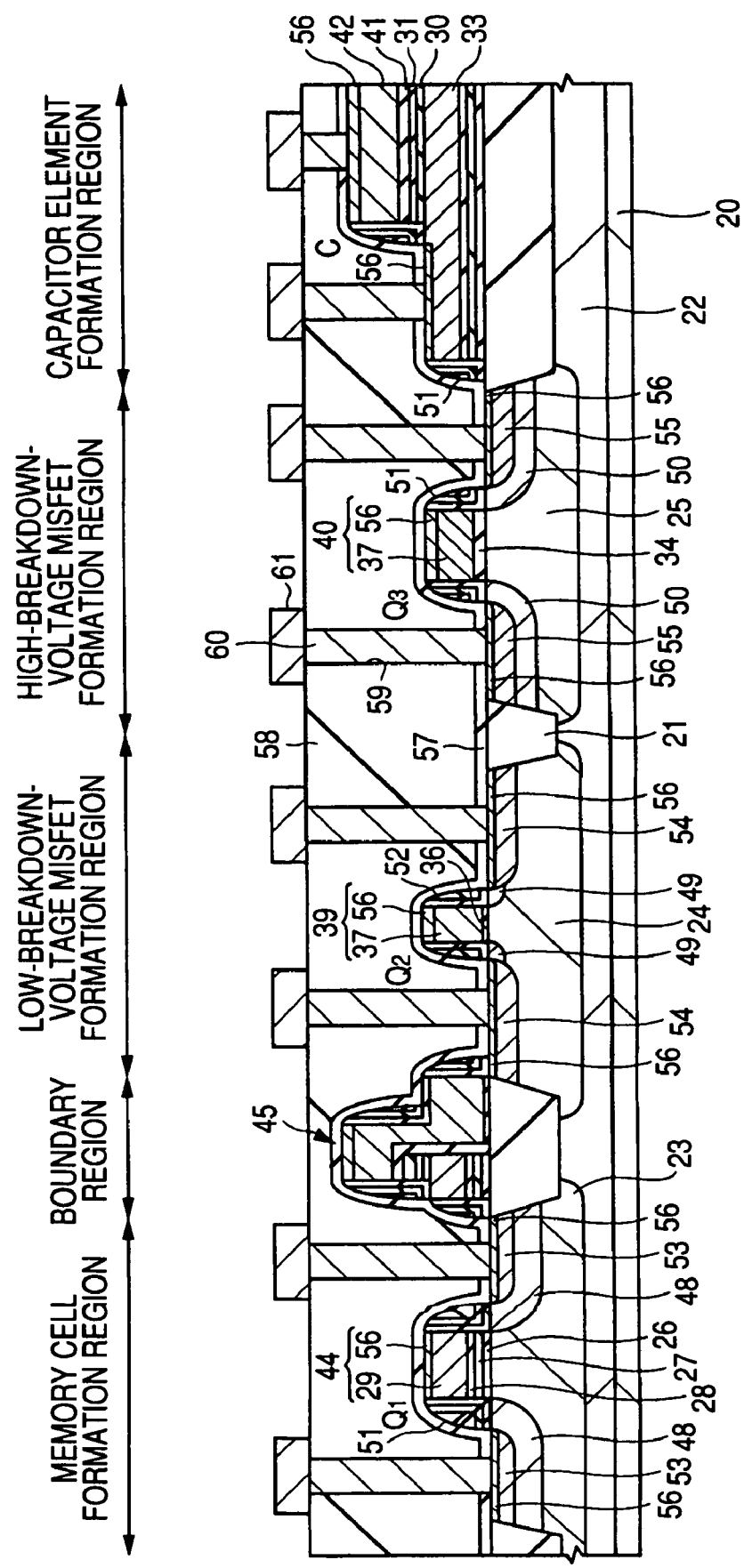
FIG. 3 is a cross-sectional view illustrating the cross-section of a semiconductor device of Embodiment 1.

FIG. 3 is a cross-sectional view of a MONOS transistor Q1, low breakdown voltage MISFET Q2, high breakdown voltage MISFET Q3 and capacitor element C formed over the chip 1. The memory cell formation region in FIG. 3 corresponds to each of a plurality of memory cell formation regions in the EEPROM (programmable nonvolatile memory) 5 in which the MONOS transistor Q1 has been formed. The low breakdown voltage MISFET formation region is a region in which the low breakdown voltage MISFET Q2 requiring a high current driving force to attain high speed operation has been formed. The formation regions of the CPU 2 and RAM 4 can be given as examples of the region in which such a low breakdown voltage MIS transistor Q2 is to be been formed. The low breakdown voltage MISFET operates at a supply voltage of about 1.5V. The high breakdown voltage MISFET formation region is a region in which the high breakdown voltage MISFET Q3 has been formed and examples of this region include the formation region of the analogue circuit 6 and a region in which a drive circuit (such as decoder) in the EEPROM 5 has been formed. This high breakdown voltage MISFET Q3 operates at a supply voltage of about 5V. In the capacitor element formation region, a capacitor element constituting a circuit has been formed. The capacitor element is made of, for example, PIP (Polysilicon Insulator Polysilicon).

As illustrated in FIG. 3, element isolation regions 21 for isolating elements have been formed in the semiconductor substrate 20 and active regions isolated by the element isolation regions 21 are the memory cell formation region, low breakdown voltage MISFET formation region and high breakdown voltage MISFET formation region, respectively. In the semiconductor substrate 20 of the memory cell formation region, low breakdown voltage MISFET formation region and high breakdown voltage MISFET formation region, an n type semiconductor region 22 which will be a well isolation layer is formed. Wells have been formed over this n type semiconductor region 22. For example, in the memory cell formation region, a p well 23 is formed over the n type semiconductor region 22. In the low breakdown voltage MISFET formation region, a p well 24 is formed over the n type semiconductor region 22. In the high breakdown voltage MISFET formation region, a p well 25 is formed over the n type semiconductor region 22. The p well 23 formed in the memory cell formation region and the p well 25 formed in the high breakdown voltage MISFET formation region are formed in the same step and have an equal impurity concentration, because the memory cell and high breakdown voltage MISFET are analogous in conditions such as a voltage applied thereto. The low breakdown voltage MISFET and high breakdown voltage MISFET are, on the other hand, different in conditions such as voltage applied thereto so that the impurity concentration of the p well 24 formed in the low breakdown voltage MISFET formation region is therefore different from that of the p well 23 or p well 25.

In this Embodiment 1, an n channel MISFET is illustrated and described as an MISFET formed in each of the low breakdown voltage MISFET formation region and high breakdown voltage MISFET formation region, but a p channel MISFET has also been formed in these regions.

The constitution of the MONOS transistor Q1 illustrated in FIG. 3 will next be described.

The MONOS transistor Q1 formed in the memory cell formation region has the following constitution. Described specifically, a gate insulating film 26 has been formed over the p well 23 formed in the semiconductor substrate 20 and a charge storage film 27 has been formed over the gate insulating film 26. An insulating film (potential barrier film) 28 has been formed over the charge storage film 27 and a gate electrode 44 made of a conductive film has been formed over the insulating film 28. The gate electrode 44 has been made of a film stack of, for example, a polysilicon film 29 and a cobalt silicide film 56 in order to lower the resistance and over the side walls on both sides of the gate electrode 44, sidewalls 51 made of, for example, an insulating film have been formed to constitute an LDD (Lightly Doped Drain) structure.

In the semiconductor substrate 20 below the sidewalls 51, lightly-doped n type impurity diffusion regions 48 and heavily-doped n type impurity diffusion regions 53 have been formed as semiconductor regions. In the p well 23 directly below the gate insulating film 26, a channel formation region made of the n type semiconductor region has been formed.

In the MONOS transistor Q1 having such a constitution, the gate insulating film 26 has been made of, for example, a silicon oxide film and it has also a function as a tunnel insulating film. For example, this MONOS transistor Q1 stores or erases data by injecting electrons into the charge storage film 27 from the semiconductor substrate 20 via the gate insulating film 26 or ejecting electrons out of the charge storage film 27 into the semiconductor substrate 20 so that the gate insulating film 26 serves as a tunnel insulating film.

The charge storage film 27 is a film disposed to store charges contributing to data memory and has been made of, for example, a silicon nitride film.

A polysilicon film has conventionally been used as the charge storage film 27. When the polysilicon film is used as the charge storage film 27, however, existence of a defect in a portion of an oxide film encompassing the charge storage film 27 leads to abnormal leakage and all the charges stored in the charge storage film 27 may escape therefrom because the charge storage film 27 is a conductor.

As described above, a silicon nitride film which is an insulator has come to be used as the charge storage film 27. In this case, charges contributing to the data memory are stored in the discrete trap level (trap level) present in the silicon nitride film. Even if a defect appears in a portion of the oxide film encompassing the charge storage film 27, the charges are stored in the discrete trap level of the charge storage film 27 so that escape of all the charges from the charge storage film 27 does not occur. The reliability of data retention can therefore be improved.

Because of the above-described reason, use of the charge storage film 27 made of not only a silicon nitride film but also a film containing a discrete trap level is useful for improving the reliability of data retention.

The sidewalls 51 have been formed to impart an LDD structure to the source and drain regions which are semiconductor regions of the MONOS transistor Q1. The source and drain regions of the MONOS transistor Q1 have been made of the lightly-doped n type impurity diffusion regions 48 and heavily-doped n type impurity diffusion regions 53. Since the lightly-doped n type impurity diffusion regions 48 have been formed as the source and drain regions below the sidewalls 51, electric field concentration below the end portions of the gate electrode 44 can be suppressed.

The constitution of the low breakdown voltage MISFET Q2 illustrated in FIG. 3 will next be described. In the low breakdown voltage MISFET Q2, a gate insulating film 36 has been formed over the p well 24 formed in the semiconductor substrate 20 and a gate electrode 39 has been formed over this gate insulating film 36. The gate insulating film 36 has been made of, for example, a silicon oxide film, while the gate electrode 39 has been made of a film stack of a polysilicon film 37 and a cobalt silicide film 56 in order to reduce its resistance.

Over the side walls on both sides of the gate electrode 39, sidewalls 52 have been formed. In the semiconductor substrate 20 below the sidewalls 52, lightly-doped n type impurity diffusion regions 49 and heavily-doped n type impurity diffusion regions 54 have been formed as semiconductor regions. In the p well 24 directly below the gate insulating film 36, a channel formation region made of a p type semiconductor region has been formed.

The constitution of the high breakdown voltage MISFET Q3 illustrated in FIG. 3 will next be described. In the high breakdown voltage MISFET Q3, a gate insulating film 34 has been formed over the p well 25 formed in the semiconductor substrate 20 and a gate electrode 40 has been formed over this gate insulating film 34. The gate insulating film 34 has been made of, for example, a silicon oxide film, while the gate electrode 40 has been made of a film stack of a polysilicon film 37 and a cobalt silicide film 56 in order to reduce its resistance.

Over the side walls on both sides of the gate electrode 40, sidewalls 51 have been formed. In the semiconductor substrate 20 below the sidewalls 51, lightly-doped n type impurity diffusion regions 50 and heavily-doped n type impurity diffusion regions 55 have been formed as semiconductor regions. In the p well 25 directly below the gate insulating film 34, a channel formation region made of a p type semiconductor region has been formed.

A difference between the low breakdown voltage MISFET Q2 and high breakdown voltage MISFET Q3 will next be described. First, the sidewalls 51 of the high breakdown voltage MISFET Q3 have a greater width than the sidewalls 52 of the low breakdown voltage MISFET Q2. Since a relatively high potential difference (about 5V) is applied to the high breakdown voltage MISFET Q3 upon operation, the width of the sidewalls 51 is made relatively great to improve the pn junction breakdown voltage between the source-drain regions and semiconductor substrate (p well 25). On the other hand, only a relatively low potential difference (about 1.5V) is applied to the low breakdown voltage MISFET Q2 upon operation so that the width of the sidewalls 52 is made relatively small to improve the high-speed operation.

Secondly, the gate electrode 40 of the high breakdown voltage MISFET Q3 has a greater gate length than the gate electrode 39 of the low breakdown voltage MISFET Q2. In the low breakdown voltage MISFET Q2, the gate length of the gate electrode 39 must be decreased to reduce a resistance between the source region and drain region and thereby improve the current driving power. In the high breakdown voltage MISFET Q3, on the other hand, the gate length is made longer because owing to a relatively high potential applied thereto, a decrease in the gate length inevitably causes punch-through between the source and drain regions.

Thirdly, the gate insulating film 34 of the high breakdown voltage MISFET Q3 is thicker than the gate insulating film 36 of the low breakdown voltage MISFET Q2 because a voltage applied to the former is higher than that applied to the latter. The gate insulating film 34 of the high breakdown voltage MISFET Q3 has therefore improved insulation resistance.

The constitution of the capacitor element C illustrated in FIG. 3 will next be described. The capacitor element C has a lower electrode 33 made of, for example, a polysilicon film and a capacitor insulating film has been formed over the lower electrode 33. The capacitor insulating film has been made of stacked insulating films, for example, a film stack of a silicon oxide film 30, silicon nitride film 31 and silicon oxide film 40. The capacitor insulating film has thereover an upper electrode 42 made of, for example, a polysilicon film. Over the surfaces of the lower electrode 33 and upper electrode 42, a cobalt silicide film 56 has been formed. By controlling the thickness of the capacitor insulating film and areas of the upper electrode 42 and lower electrode 33, the capacitor element C have a desired capacitance.

Over the MONOS transistor Q1, low breakdown voltage MISFET Q2, high breakdown voltage MISFET Q3 and capacitor element C, an interlayer insulating film made of a silicon nitride film 57 and a silicon oxide film 58 has been formed. In the interlayer insulating film, contact holes 59 have been formed. Plugs 60 have been formed so as to bury therewith the contact holes 59. The plugs 60 have been made of, for example, a titanium/titanium nitride film as a barrier film and a tungsten film. Over the interlayer insulating film having the plugs 60 formed therein, interconnects 61 made of an aluminum film or aluminum alloy film have been formed.

The semiconductor device of Embodiment 1 has a constitution as described above. The characteristic constitution of Embodiment 1 will next be described. In FIG. 3, one of the characteristics of the present invention is that the formation of bird's beaks is prevented in each of the MONOS transistor Q1, low breakdown voltage MISFET Q2 and high breakdown voltage MISFET Q3.

According to the conventional manufacturing method, the gate electrode of the MONOS transistor and gate electrode of each of the MISFETs (low breakdown voltage MISFET and high breakdown voltage MISFET) for peripheral circuit are formed by obtaining either one by processing, depositing a gate insulating film and a conductor film thereover and then obtaining the other one by processing. The surface of the gate electrode formed first is therefore oxidized when the other gate electrode is formed. In particular, bird's beaks appear between the gate electrode formed first and the semiconductor substrate and increase the thickness of the gate insulating film at the end portions thereof. For example, when the gate electrode formed first is an MONOS transistor, the gate insulating film of the MONOS transistor functions as a tunnel insulating film during injection or ejection of electrons to or out of the charge storage film. An increased thickness of the gate insulating film due to the formation of bird' peaks therefore disturbs occurrence of a tunnel phenomenon and further disturbs injection or ejection of electrons into or out of the charge storage film. This retards the writing or erasing of data, and deteriorates the characteristics of the MONOS transistor. When the gate electrode formed first is an MISFET for peripheral circuit, on the other hand, generation of bird's beaks also deteriorate the characteristics of it.

In Embodiment 1, generation of bird's beaks is prevented by employing the following manufacturing method, that is, by—prior to the processing for the formation of the gate electrode of the MONOS transistor and the gate electrode of the MISFET for peripheral circuit—forming a conductor film for the formation of the gate electrode of the MONOS transistor and a conductor film for the formation of the gate electrode of the MISFET for peripheral circuit and then processing them into the gate electrode of the MONOS transistor and the gate electrode of the MISFET for peripheral circuit. It is therefore possible to prevent generation of bird's beaks in both transistors, thereby improving the reliability of the semiconductor device. When such a manufacturing method is employed, a dummy pattern 45 is formed in a boundary region between the memory cell formation region and the MISFET formation region for peripheral circuit (low breakdown voltage MISFET formation region in FIG. 3). The manufacturing method of Embodiment 1 leaves, as its footprint, the dummy pattern 45 in the boundary region. The dummy pattern 45 can be deformed or eliminated, depending on how the resist pattern is patterned. Illustrated in FIG. 3 is one example of using the manufacturing method of the semiconductor device of Embodiment 1 in which the dummy pattern 45 has been formed.

The semiconductor device according to Embodiment 1 has the above-described constitution. The operation of the memory cell (nonvolatile memory cell) included in this semiconductor device will next be described with reference to accompanying drawings.

Figure 4:
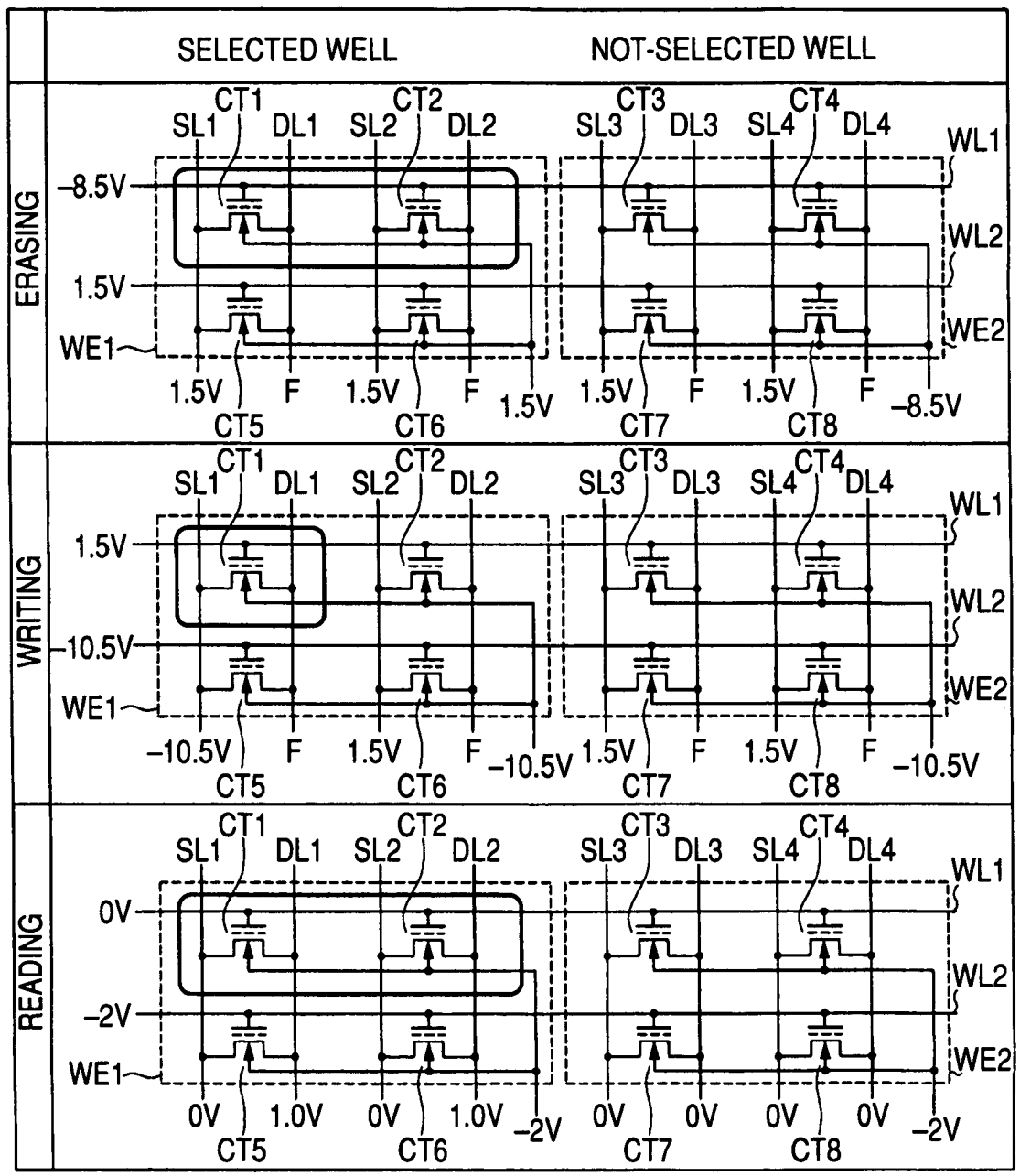
FIG. 4 is a schematic view illustrating one example of the memory array structure and operation conditions (1 cell/1 transistor) of the EEPROM illustrated in FIG. 1.

FIG. 4 is a schematic view illustrating one example of the memory array structure and operation conditions (1 cell/1 transistor) of the EEPROM 5 illustrated in FIG. 1. Each memory cell shown in FIG. 4 is one example of a memory cell composed alone of a charge accumulating transistor.

The memory-cells are made of the MONOS transistor illustrated in FIG. 3 and have cell transistors CT1 to CT8 as illustrated in FIG. 4. The gate electrodes of the cell transistors CT1 to CT8 are connected to word lines WL1 to WL2 and their source regions are connected to source lines SL1 to SL4. Their drain regions are connected to data lines DL1 to DL4. The back gates of the cell transistors CT1, CT2, CT5 and CT6 are connected to a well WE1, while the back gates of the cell transistors CT3, CT4, CT7 and CT8 are connected to a well WE2.

To simplify the description, memory cells are arranged in two rows and four columns in FIG. 4, but they are not limited thereto. In practice, more memory cells are arranged in the matrix form to constitute a memory array. In FIG. 4, the memory cell arrangement which shares the same well and the same word line is two-column constitution of, for example, the cell transistors CT1 and CT2. In an 8-bit (1 byte) constitution, eight columns of cell transistors share the same well. In this case, the erase and write operations of the memory cell are performed one byte at a time.

Erase, write and read operations of a 1 cell/1 transistor type memory cell will next be described based on FIG. 4.

First, the erase operation will be described on the assumption that the memory cell whose data are to be erased (selected memory cell) is selected and data stored in the cell transistors CT1 and CT2 thereof are erased. The potentials of the selected well WE1, word line WL1, source line SL1,SL2 and data line DL1,DL2 are adjusted to 1.5V, −8.5V, 1.5V and floating potential, respectively. The charges stored in the charge storage film of the cell transistors CT1 and CT2 are then withdrawn to the semiconductor substrate side and data are erased. With regard to the cell transistors CT3 to CT8 of the other memory cells whose data are not erased (not-selected memory cells), the potentials of the not-selected well WE2, word line WL2, source lines SL3,SL4 and data lines DL3,DL4 are set to −8.5V, 1.5V, 1.5V and floating potential, respectively. Escape of the charges stored in the charge storage film of the cell transistors CT3 to CT8 is thus prevented, whereby the data are not erased.

Next, the write operation will be described on the assumption that the memory cell in which data are to be written (selected memory cell) is selected and data are written in the cell transistor CT1 thereof. The potentials of the selected well WE1, word line WL1, source line SL1 and data line DL1 are set to −10.5V, 1.5V, −10.5V and floating potential, respectively. The charges are injected into the charge storage film of the cell transistors CT1 and data are written therein. With regard to the cell transistors CT2 to CT8 in which data are not written (not-selected memory cells), the potentials of the not-selected well WE2, word line WL2, source lines SL2 to 4 and data lines DL2 to DL4 are set to −10.5V, −10.5V, 1.5V and floating potential, respectively. Injection of charges into the charge storage film of the cell transistors CT2 to 8 is thus prevented.

Next, read operation will be described, for example, on the assumption that writing of data "1" in the cell transistor CT1 has increased the threshold voltage of the transistor, while data "0" in the cell transistor CT2 has lowered the threshold voltage. When the data are read out from the cell transistors CT1 and 2, the potentials of the selected well WE1, word line WL1, source lines SL1 and SL2 and data lines DL1 and DL2 are set at −2V, 0V, 0V and 1V, respectively. In such a manner, the data are read out from the cell transistors CT1 and CT2. In this case, since the threshold voltage of the cell transistor CT1 is high and that of the cell transistor CT2 is low, the potential of the data line DL2 lowers without a change in the potential of the data line DL1. With regard to the other memory cells CT3 to CT8 from which no data are read out, the potentials of the not-selected well WE2, word line WL2, source lines SL3, SL4 and data lines DL3,DL4 are set at −2V, −2V, 0V and 0V, respectively, whereby the cell transistors CT3 to CT8 are prevented from turning on. By decreasing the back gate potential of the not-selected memory cells during read operation, the memory cell does not need a selected transistor.

The manufacturing method of the semiconductor device according to Embodiment 1 will next be described with reference to accompanying drawings. In Embodiment 1, the memory cell formation region corresponds to the first region, while the low breakdown voltage MISFET formation region and high breakdown voltage MISFET formation region each corresponds to the second region. In other words, the MONOS transistor corresponds to the first MISFET and the low breakdown voltage MISFET and high breakdown voltage MISFET each corresponds to the second MISFET.

Figure 5:
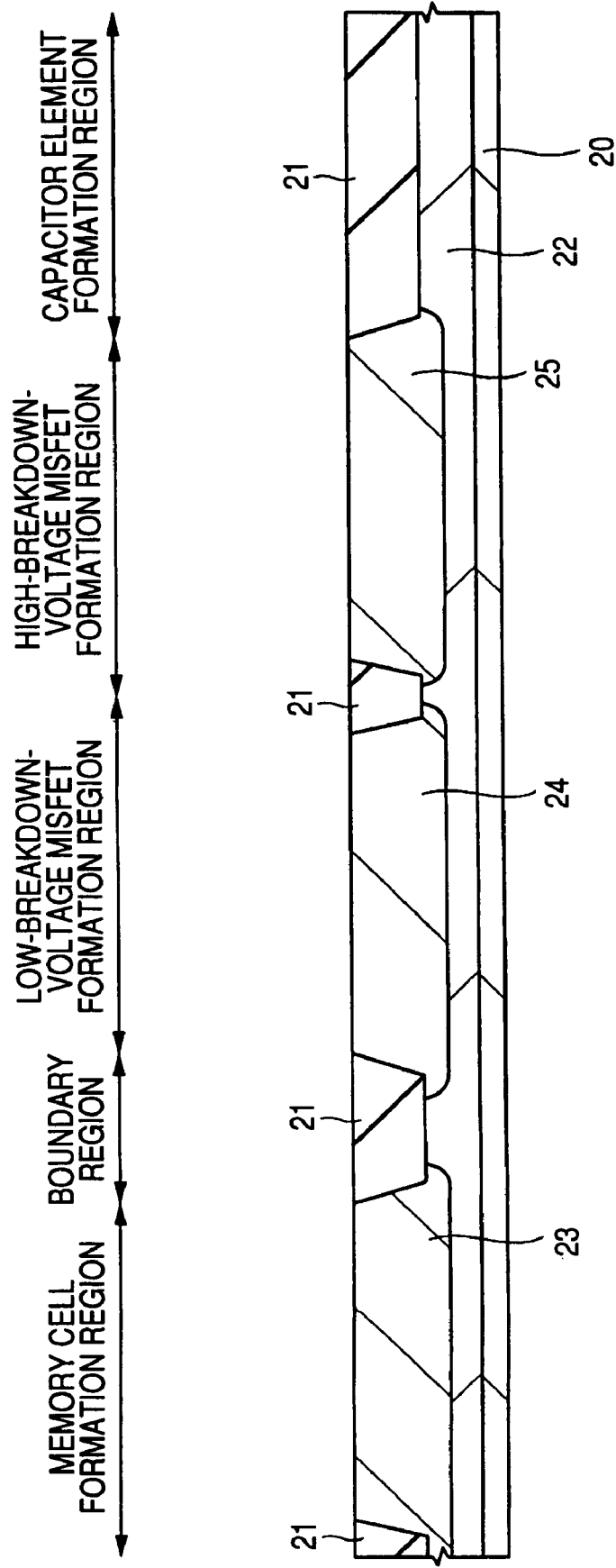
FIG. 5 is a cross-sectional view illustrating a manufacturing step of the semiconductor device according to Embodiment 1.

As illustrated in FIG. 5, a semiconductor substrate 20 having a p type impurity such as boron (B) introduced in single crystal silicon is prepared. Over the main surface of the semiconductor substrate 20, element isolation regions 21 are formed. The element isolation regions 21 are each made of, for example, a silicon oxide film and can be formed by STI (Shallow Trench Isolation) or LOCOS (Local Oxidization of Silicon). FIG. 5 illustrates the element isolation regions 21 formed in accordance with STI by burying a silicon oxide film in a trench formed in the semiconductor substrate 20.

An n type semiconductor region 22 which will be a well isolation layer is formed in the semiconductor substrate 20 by using photolithography and ion implantation. The n type semiconductor region 22 is formed, for example, by introducing an n type impurity such as phosphorus (P) or arsenic (As) into the semiconductor substrate 20.

By photolithography and ion implantation, a p well 23 is formed in the memory cell formation region, while a p well 25 is formed in the high breakdown voltage MISFET formation region. The p well 23 and p well 25 can be formed, for example, by introducing a p type impurity such as boron into the semiconductor substrate 20. These wells have the same impurity concentration. Then, by photolithography and ion implantation, a channel formation region is formed in the memory cell formation region. The channel formation region can be formed, for example, by introducing an n type impurity such as phosphorus (P) or arsenic (As). Similarly, a channel formation region is formed in the high breakdown voltage MISFET formation region. The channel formation region can be formed, for example, by introducing a p type impurity such as boron (B). Similarly, by ion implantation, a p well 24 is formed in the low breakdown voltage MISFET formation region. The p well 24 has, for example, a p type impurity such as boron introduced therein and has an impurity concentration suited for the characteristics of the low breakdown voltage MISFET. In other words, the p well 23 formed in the memory cell region and the p well 25 formed in the high breakdown voltage MISFET formation region have the same impurity concentration, while the p well 24 formed in the low breakdown voltage MISFET formation region has an impurity concentration different from that of the p well 23 or p well 25. A channel formation region is then formed on the surface of the p well 24. This channel formation region is formed, for example, by introducing therein a p type impurity such as boron.

Figure 6:
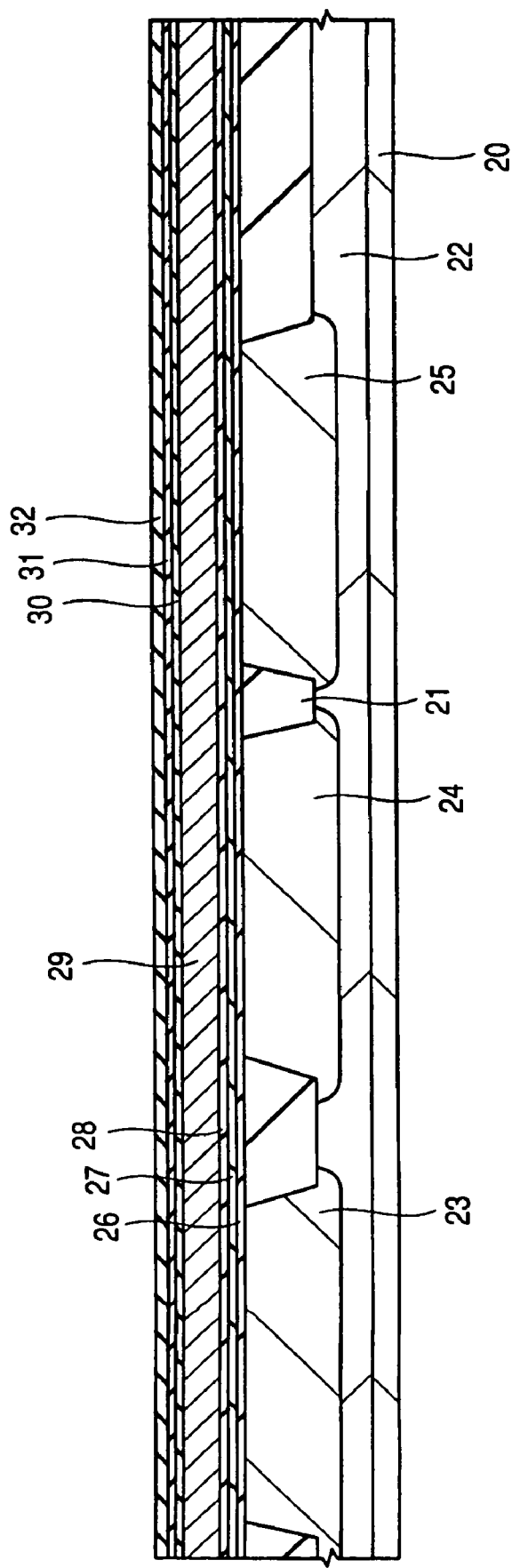
FIG. 6 is a cross-sectional view illustrating a manufacturing step of the semiconductor device following the step of FIG. 5.

As illustrated in FIG. 6, a gate insulating film (first potential barrier film) 26 is then formed over the main surface of the semiconductor substrate 20. The gate insulating film 26 is made of, for example, a silicon oxide film and can be formed by thermal oxidation. A charge storage film 27 is then formed over the gate insulating film 26. The charge storage film 27 is made of, for example, a silicon nitride film and can be formed using CVD in which chemical reaction is effected between a silane gas ($SiH_4$) and an ammonia gas ($NH_3$). The charge storage film 27 is not limited to the silicon nitride film, but may be a film having a trap level therein, for example, silicon oxynitride film (SiON).

An insulating film (second potential barrier film) 28 is then formed over the charge storage film 27. The insulating film 28 is made of, for example, a silicon oxide film and can be formed using CVD in which chemical reaction is effected between a silane gas ($SiH_4$) and an oxygen gas ($O_2$). An insulating film stack (ONO film, first insulating film) composed of the gate insulating film 26, charge storage film 27 and insulating film 28 is thus formed.

A polysilicon film (first conductor film) 29 is then formed over the insulating film 28. The polysilicon film 29 can be formed, for example, by CVD in which thermal decomposition of a silane gas is performed in a nitrogen gas ($N_2$). When the polysilicon film 29 is formed, a conductive impurity such as phosphorus is added. Alternatively, after completion of the formation of the polysilicon film 29, the conductive impurity may be injected into the polysilicon film by ion implantation.

Over the polysilicon film 29, a film stack composed of a silicon oxide film 30, a silicon nitride film 31 and a cap insulating film 32 is formed. The cap insulating film 32 is made of, for example, a silicon oxide film. The film stack can be formed, for example, by CVD. The cap insulating film 32 has a function of protecting a gate electrode 44 which will be formed in the later step.

Figure 7:
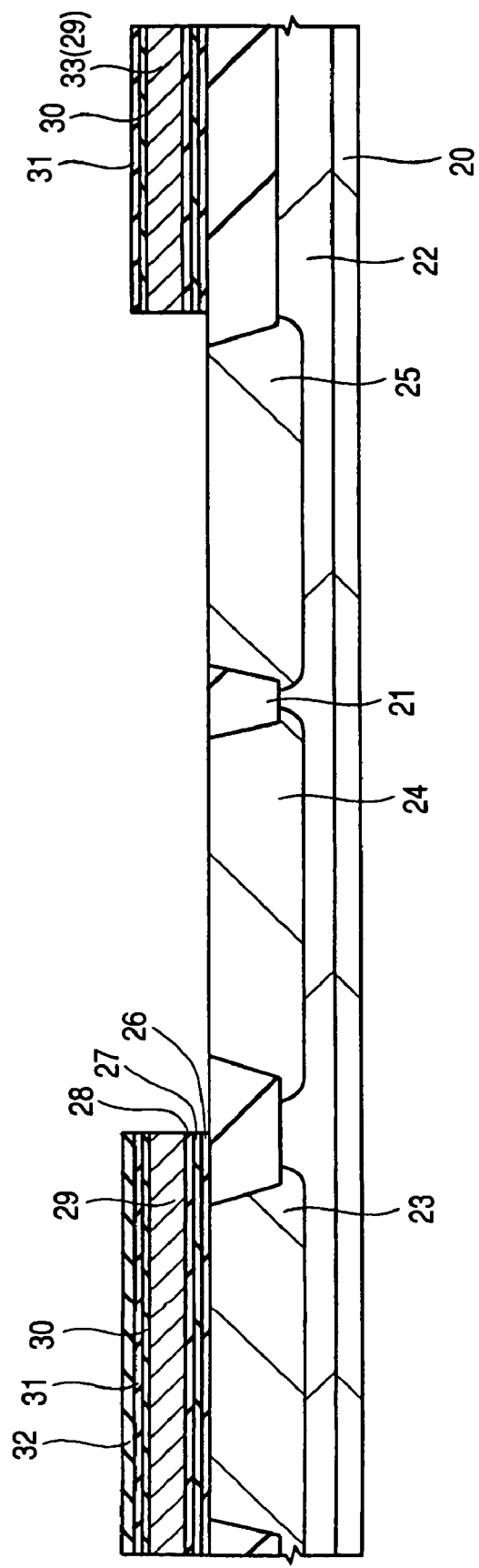
FIG. 7 is a cross-sectional view illustrating a manufacturing step of the semiconductor device following the step of FIG. 6.

As illustrated in FIG. 7, the gate insulating film 26, charge storage film 27, insulating film 28, polysilicon film 29, silicon oxide film 30, silicon nitride film 31 and cap insulating film 32 are patterned by photolithography and etching. The patterning is performed to leave the film stack in the memory cell formation region and capacitor element formation region, while removing the film stack from the low breakdown voltage MISFET formation region and high breakdown voltage MISFET formation region. By this patterning, a lower electrode 33 made of the polysilicon film 29 is formed in the capacitor element formation region. The patterning is conducted to cover the whole memory cell formation region and processing for forming a gate electrode of the MONOS transistor in the memory cell formation region is not performed. This is one of the characteristics of the present invention. When in this step, a gate electrode of the MONOS transistor is formed in the memory cell formation region, bird's beaks undesirably appear in the MONOS transistor because this step is followed by the formation of a gate insulating film made of, for example, a silicon oxide film in the low breakdown voltage formation region and high breakdown voltage MISFET formation region. In Embodiment 1, in order to prevent occurrence of bird's beaks in the MONOS transistor, a film stack is left all over the memory cell formation region.

Figure 8:
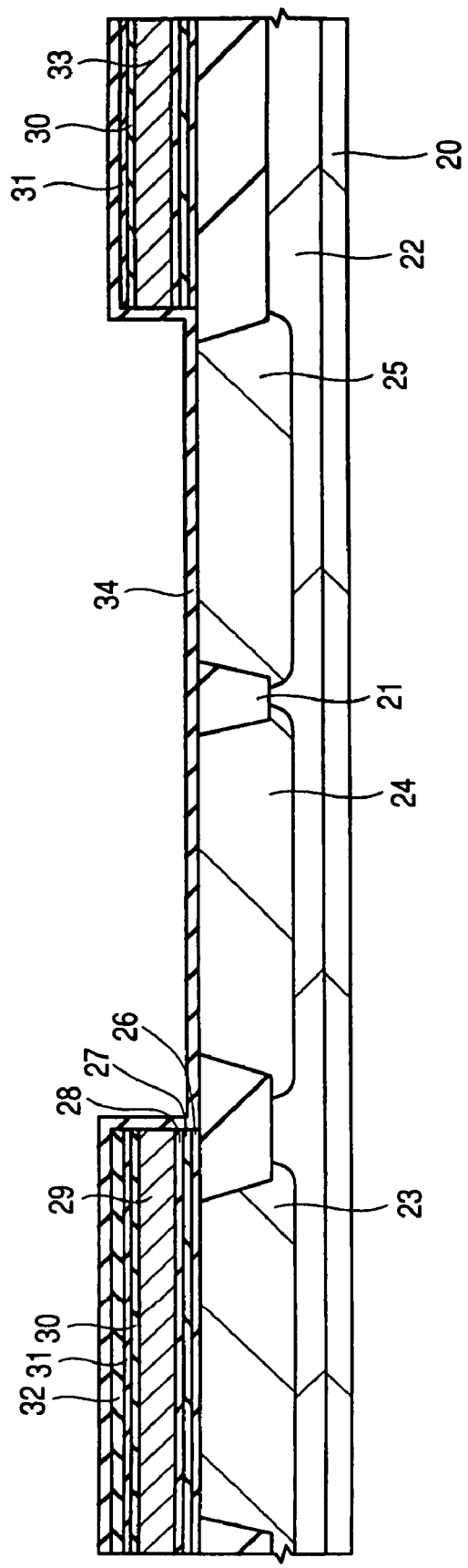
FIG. 8 is a cross-sectional view illustrating a manufacturing step of the semiconductor device following the step of FIG. 7.
Figure 9:
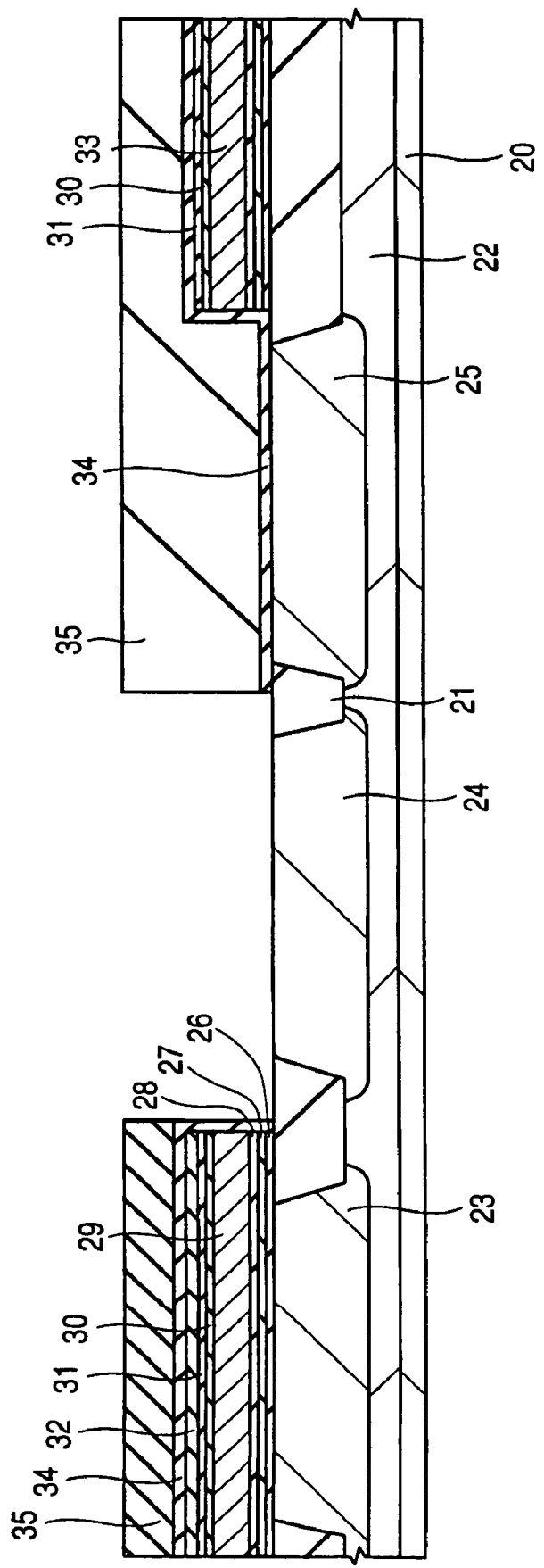
FIG. 9 is a cross-sectional view illustrating a manufacturing step of the semiconductor device following the step of FIG. 8.

As illustrated in FIG. 8, a gate insulating film (second insulating film) 34 is formed over the entire surface of the semiconductor substrate 20, for example, by thermal oxidation. This gate insulating film 34 is made of, for example, a silicon oxide film. As illustrated in FIG. 9, a resist pattern 35 is formed over the semiconductor substrate 20. The resist pattern 35 is patterned so as to cover therewith the memory cell region, high breakdown voltage MISFET formation region and capacitor element formation region and expose the low breakdown voltage MISFET formation region. With the resist pattern 35 as a mask, the gate insulating film 34 is removed from the low breakdown voltage MISFET formation region by etching.

Figure 10:
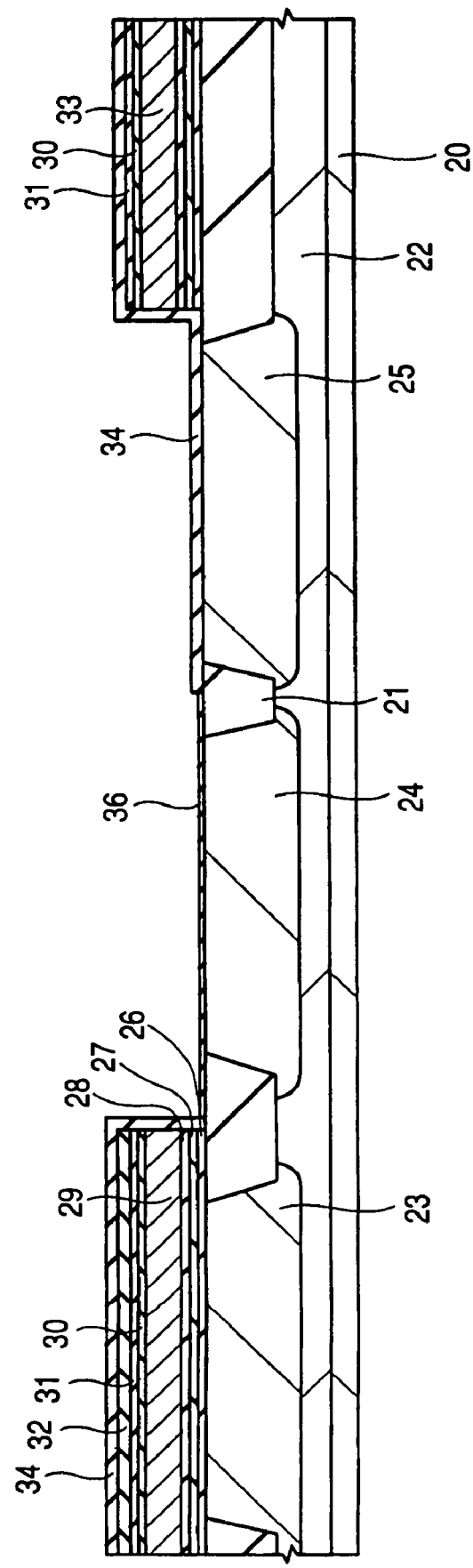
FIG. 10 is a cross-sectional view illustrating a manufacturing step of the semiconductor device following the step of FIG. 9.

As illustrated in FIG. 10, a gate insulating film (second insulating film) 36 is then formed over the semiconductor substrate 20, whereby the gate insulating film 36 is formed in the low breakdown voltage MISFET formation region. The gate insulating film 34 formed in the high breakdown voltage MISFET formation region has an increased thickness after the step of forming the gate insulating film 36. In such a manner, a relatively thin gate insulating film 36 is formed in the low breakdown voltage MISFET formation region, while a relatively thick gate insulating film 34 is formed in the high breakdown voltage MISFET formation region.

Figure 11:
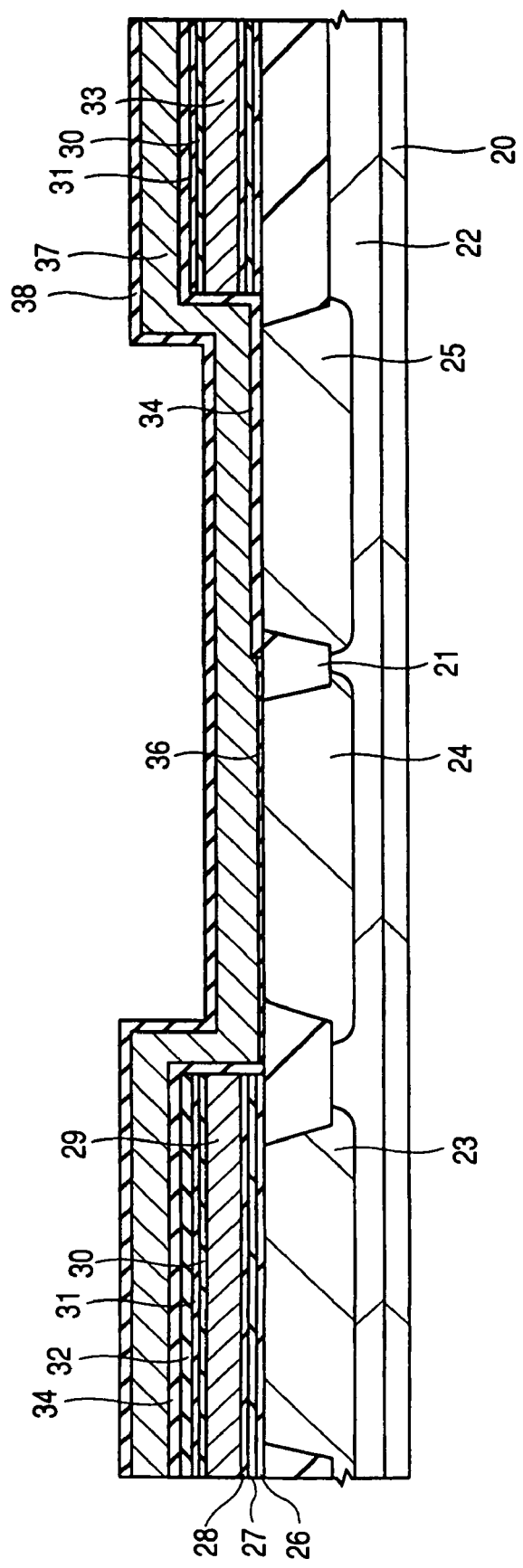
FIG. 11 is a cross-sectional view illustrating a manufacturing step of the semiconductor device following the step of FIG. 10.

As illustrated in FIG. 11, a polysilicon film (second conductor film) 37 is then formed over the gate insulating film 34 and gate insulating film 36, followed by the formation of a cap insulating film 38 over the polysilicon film 37. The polysilicon film 37 can be formed, for example, by CVD. The cap insulating film 38 is made of, for example, a silicon oxide film and can be formed, for example, by CVD.

Figure 12:
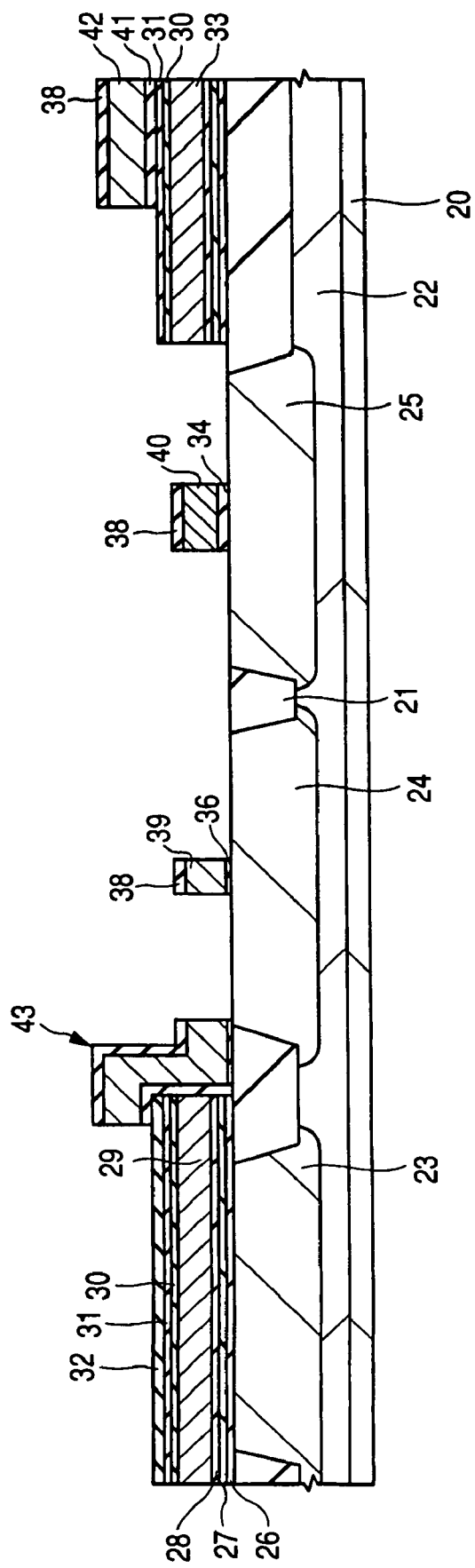
FIG. 12 is a cross-sectional view illustrating a manufacturing step of the semiconductor device following the step of FIG. 11.

As illustrated in FIG. 12, by photolithography and etching, a gate electrode (second gate electrode) 39 of the low breakdown voltage MISFET is formed in the low breakdown voltage MISFET formation region, and a gate electrode (second gate electrode) 40 of the high breakdown voltage MISFET is formed in the high breakdown voltage MISFET formation region. Upon etching, the gate insulating film 34, polysilicon film 37 and cap insulating film 38 formed over the memory cell formation region are removed. In the capacitor element formation region, the gate insulating film 34, polysilicon film 37 and cap insulating film 38 are patterned to form a capacitor insulating film and an upper electrode 42 formed thereover. The capacitor insulating film is made of a silicon oxide film 30, a silicon nitride film 31, and a silicon oxide film 41. By this patterning, a dummy pattern 43 remains in a boundary region between the memory cell formation region and low breakdown voltage MISFET formation region.

Figure 13:
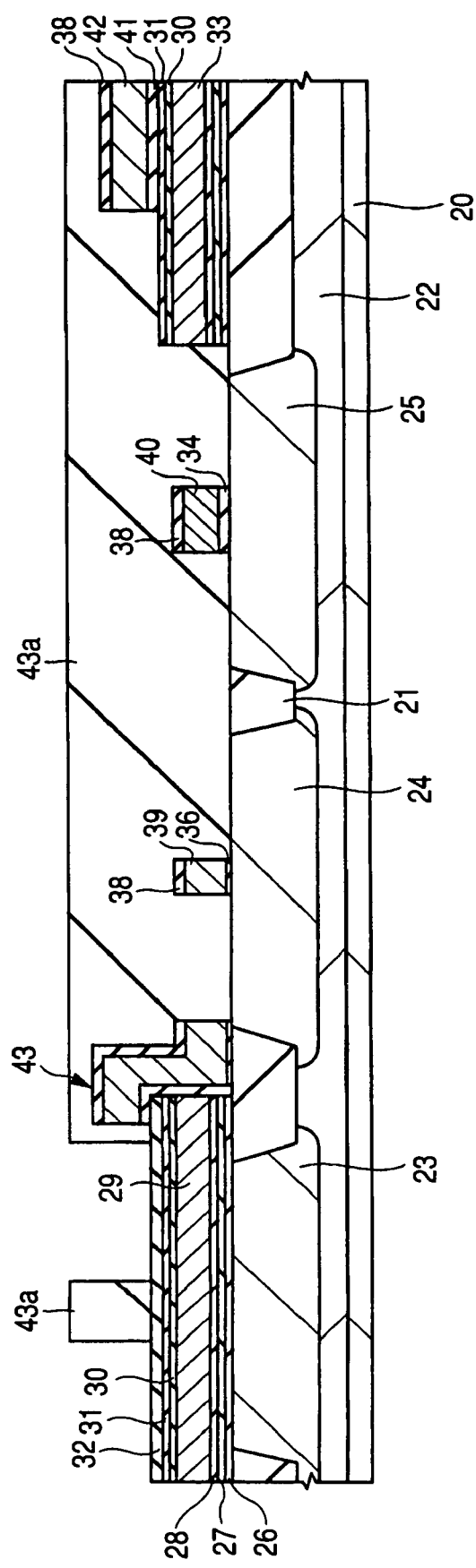
FIG. 13 is a cross-sectional view illustrating a manufacturing step of the semiconductor device following the step of FIG. 12.

As illustrated in FIG. 13, a resist pattern 43a is formed over the semiconductor substrate 20. The resist pattern 43a has been patterned to cover therewith the low breakdown voltage MISFET formation region, high breakdown voltage MISFET formation region, boundary region and capacitor element formation region. The resist pattern 43a is also formed in a gate electrode formation region in the memory cell formation region and it has been patterned so as to expose regions other than the memory cell formation region.

Figure 14:
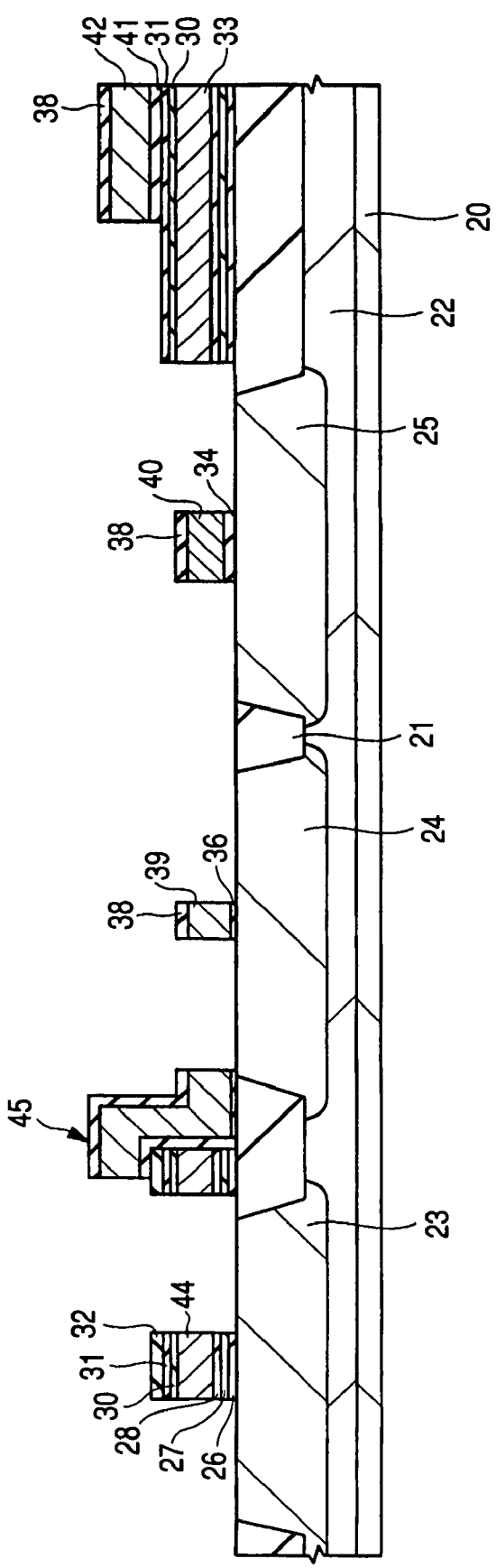
FIG. 14 is a cross-sectional view illustrating a manufacturing step of the semiconductor device following the step of FIG. 13.

As illustrated in FIG. 14, by etching with the resist pattern 43a as a mask, a gate electrode (first gate electrode) 44 of the MONOS transistor is formed in the memory cell formation region. At this time, a dummy pattern 45 is formed in the boundary region between the memory cell formation region and low breakdown voltage MISFET formation region.

In such a manner, the gate electrode 44 of the MONOS transistor can be formed in the memory cell formation region. A gate electrode 39 of the low breakdown voltage MISFET can be formed in the low breakdown voltage MISFET formation region, while a gate electrode 40 of the high breakdown voltage MISFET can be formed in the high breakdown voltage MISFET formation region.

According to Embodiment 1, as illustrated in FIG. 11, without forming either one of the gate electrodes by processing, the gate insulating film 26, charge storage film 27, insulating film 28 and polysilicon film 29 are formed in the memory cell formation region, while the gate insulating films 36 and 34 and polysilicon film 37 are formed in the low breakdown voltage MISFET formation region and high breakdown voltage MISFET formation region. As illustrated in FIG. 12, the gate electrode 39 is formed in the low breakdown voltage MISFET formation region and the gate electrode 40 is formed in the high breakdown voltage MISFET formation region. Since the gate insulating film 26, charge storage film 27, insulating film 28 and polysilicon film 29 have already been formed in the memory cell formation region, it is not necessary to form the gate insulating film 26 after the gate electrodes 39 and 40 are formed by processing. The gate electrodes 39 and 40 are not oxidized at the end portions thereof, whereby generation of bird's peaks can be prevented. As illustrated in FIG. 13, the gate insulating film 26, charge storage film 27, insulating film 28 and polysilicon film 29 formed in the memory cell formation region in advance are then processed to form the gate electrode 44 of the MONOS transistor in the memory cell formation region.

Conventionally, the gate insulating film of the MONOS transistor is formed over the entire surface of the semiconductor substrate after the formation of the gate electrodes in the low breakdown voltage MISFET formation region and high breakdown voltage MISFET formation region, respectively. When the gate insulating film of the MONOS transistor is formed, the gate electrode is oxidized at the end portions thereof and bird's beaks appear at the end portions of the gate insulating film of the low breakdown voltage MISFET and high breakdown voltage MISFET. Appearance of the bird's beaks at the end portions of the gate insulating film of the low breakdown voltage MISFET and high breakdown voltage MISFET causes an increase in the film thickness. The increase in the thickness of the gate insulating films of the low breakdown voltage MISFET and high breakdown voltage MISFET leads to a decrease in the current flowing between source and drain regions of the low breakdown voltage MISFET and high breakdown voltage MISFET. The magnitude of the current is inversely proportional to the thickness of the gate insulating film. By an increase in the thickness of the gate insulating film, current flowing between source and drain regions cannot be secured and the MISFET has inevitably deteriorated characteristics. Moreover, as the low breakdown voltage MISFET becomes minute, the gate length of the gate electrode decreases and short channel characteristics such as a reduction in threshold voltage become prominent. The thinner the gate insulating film, the more improved the short channel characteristics. When the gate insulating film becomes thick by bird' beaks, short channel characteristics become prominent and characteristics of the low breakdown voltage deteriorate.

In Embodiment 1, it is not necessary to form the gate insulating film 26 after the processing for the formation of the gate electrodes 39 and 40 so that generation of bird's beaks can be prevented in the low breakdown voltage MISFET and high breakdown voltage MISFET and improvement in the reliability of the low breakdown voltage MISFET and high breakdown voltage MISFET can be actualized.

According to Embodiment 1, when processing for the formation of the gate electrode 44 of the MONOS transistor is performed, any of the gate insulating film 26, charge storage film 27, insulating film 28 and polysilicon film 29 are not deposited over the gate electrode 39 of the low breakdown voltage MISFET and the gate electrode 40 of the high breakdown voltage MISFET which have already been formed, an etching residue does not remain on the side walls of the gate electrodes 39 and 40. A step of removing the etching residue from the side walls of the gate electrodes 39 and 40 which have been formed first is not necessary and therefore the gate electrodes 39 and 40 are free from etching damage. Described specifically, when an etching residue remains on the side walls of the gate electrodes 39 and 40, dry etching is performed to remove this etching residue. The etching residue is removed by this etching but, there is a fear of end portions of the gate electrodes 39 and 40 being damaged upon removal of the etching residue. In this Embodiment 1, however, no etching residue is formed on the side walls of the gate electrodes 39 and 40 formed in advance so that dry etching step for removing the etching residue is not necessary and therefore the gate electrodes 39 and 40 can therefore be protected from the damage. In Embodiment 1, as illustrated in FIG. 14, the dummy pattern 45 remains in the boundary region between the memory cell formation region and low breakdown voltage MISFET formation region. It is formed in a region other than the element formation region so that it does not pose any problem. In Embodiment 1, although the dummy pattern 45 is formed, removal of it is not necessary, which means, addition of a removing step of the dummy pattern 45 is not necessary. Without addition of a removing step, the manufacturing step remains simple and a manufacturing cost does not increase. If a step of removing the dummy pattern 45 is performed, on the contrary, the peeled dummy pattern may cause a problem as foreign matters. The dummy pattern 45 is large and therefore does not peel off naturally. It is preferred to leave it also from the viewpoint of preventing generation of foreign matters.

Figure 15:
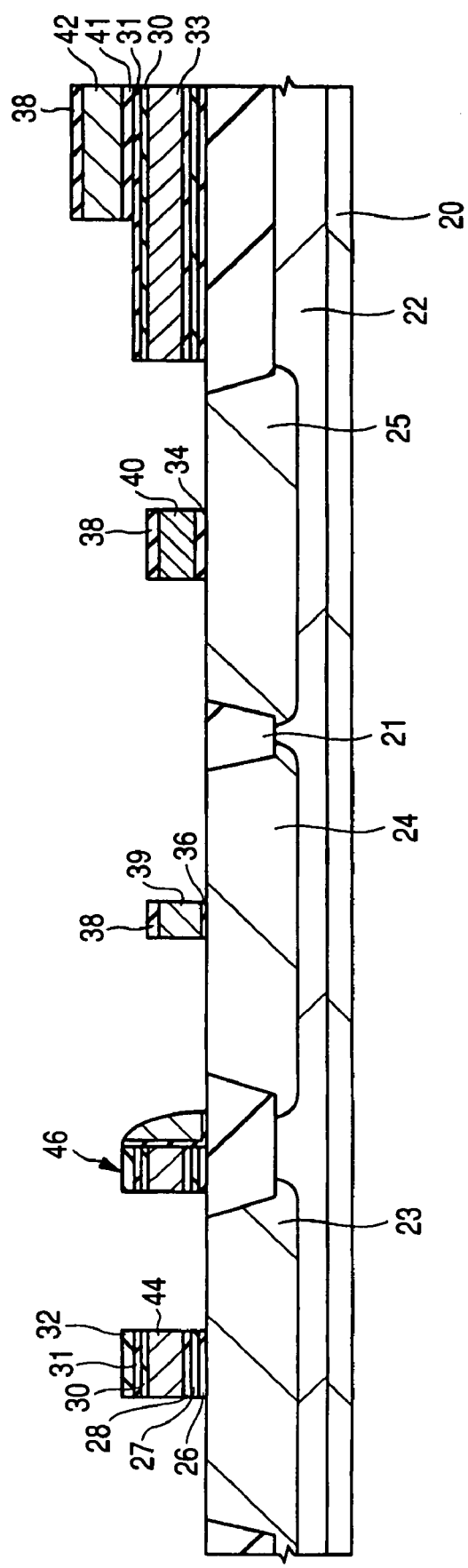
FIG. 15 is a cross-sectional view illustrating a manufacturing step of the semiconductor device in a modification example.
Figure 16:
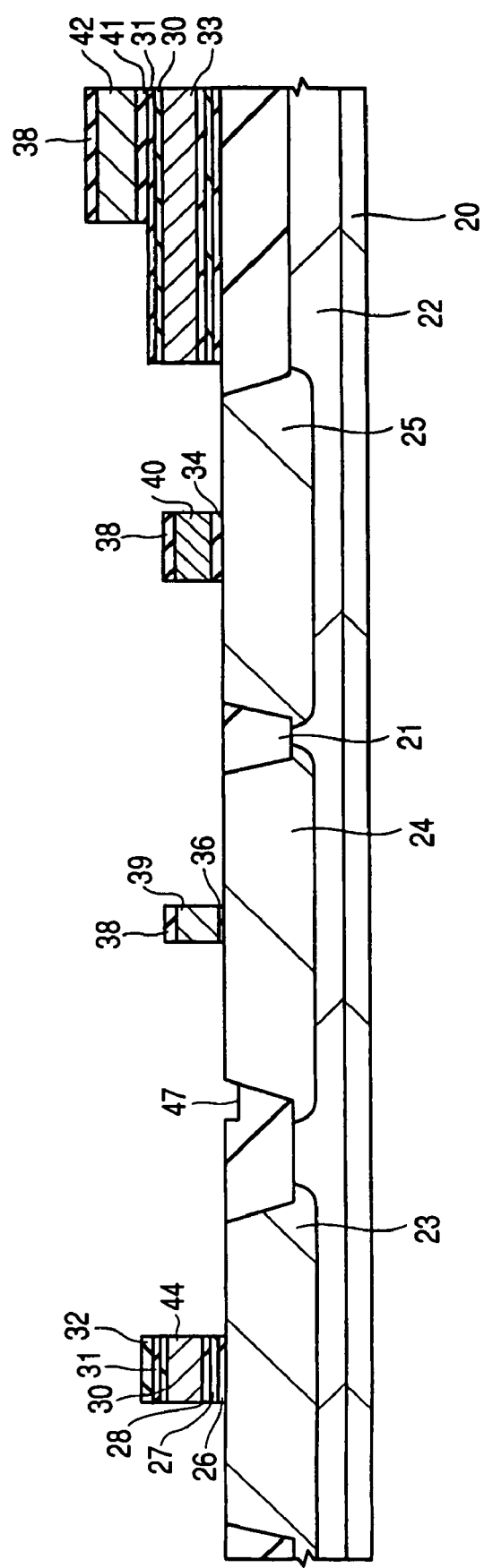
FIG. 16 is a cross-sectional view illustrating a manufacturing step of the semiconductor device in another modification example.

This dummy pattern 45 has various shapes according to the patterning of the resist pattern. The dummy pattern 45 as shown in FIG. 14 may remain or a dummy pattern 46 as illustrated in FIG. 15 may remain. By adjusting the resist pattern, it is possible not to leave a dummy pattern in the boundary region as illustrated in FIG. 16. In this case, a portion of the element isolation region 21 formed in the boundary region is etched into a recess 47.

In the conventional method, after the formation of the gate electrode of the low breakdown voltage MISFET and the gate electrode of the high breakdown voltage MISFET, a gate insulating film, charge storage film, insulating film and polysilicon film for the formation of an MONOS transistor have been deposited in each of the memory cell formation region, low breakdown voltage MISFET formation region and high breakdown voltage MISFET formation region. When the gate electrode of the MONOS transistor is formed by processing, the polysilicon film, insulating film, charge storage film and gate insulating film remaining in the low breakdown voltage MISFET formation region and high breakdown voltage MISFET formation region are removed. When the charge storage film made of a silicon nitride film is removed, a silicon oxide film lying below the charge storage film is undesirably thin. The gate electrode of the low breakdown voltage MISFET or gate electrode of the high breakdown voltage MISFET is exposed, at the edges thereof, to hot phosphoric acid used for the removal of the silicon nitride film, which may lead to an increase in the gate defect density or troubles due to gouging of the semiconductor substrate in the low breakdown voltage MISFET formation region or high breakdown voltage MISFET formation region.

According to Embodiment 1, on the other hand, any of the gate insulating film 26, charge storage film 27, insulating film 28 and polysilicon film 29 is not deposited over the gate electrode 39 of the low breakdown voltage MISFET and gate electrode 40 of the high breakdown voltage MISFET which have been formed in advance. During the processing for the formation of the gate electrode 44 of the MONOS transistor, the low breakdown voltage MISFET formation region and high breakdown voltage MISFET formation region have been covered with the resist pattern 43a. It is therefore possible to prevent the above-described problems such as increase in the gate defect density or gouging of the semiconductor substrate in the low breakdown voltage MISFET formation region or high breakdown voltage MISFET formation region, which will otherwise occur when the gate electrode of the low breakdown voltage MISFET or the high breakdown voltage MISFET is exposed, at the end portions thereof, to hot phosphoric acid.

According to Embodiment 1, the formation of the gate electrode 44 of the MONOS transistor is not followed by the formation of a gate insulating film of another transistor. No bird's beak is therefore formed in the MONOS transistor. Thickening of the gate insulating film at the end portions thereof which will otherwise occur by bird's beaks can therefore be prevented. The tunnel phenomenon is therefore not disturbed and passage of electrons into or from a charge storage film can be carried out smoothly. In short, it is possible to prevent retardation of write or erase operation of data or deterioration of the characteristics of the MONOS transistor.

The manufacturing method of the semiconductor device according to Embodiment 1 makes it possible to prevent generation of bird's beaks in any one of the MONOS transistor formed in the memory cell formation region, low breakdown voltage MISFET formed in the low breakdown voltage MISFET formation region, and high breakdown voltage MISFET formed in the high breakdown voltage MISFET formation region, thereby improving the reliability of the semiconductor device.

Figure 17:
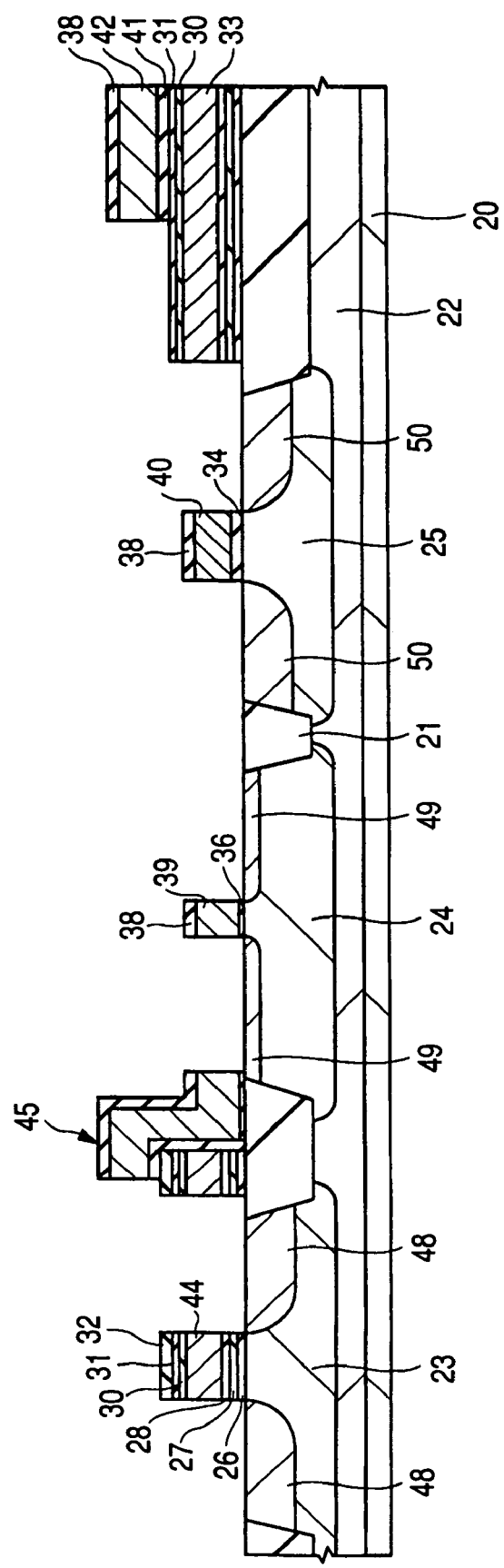
FIG. 17 is a cross-sectional view illustrating a manufacturing step of the semiconductor device following the step of FIG. 14.
Figure 18:
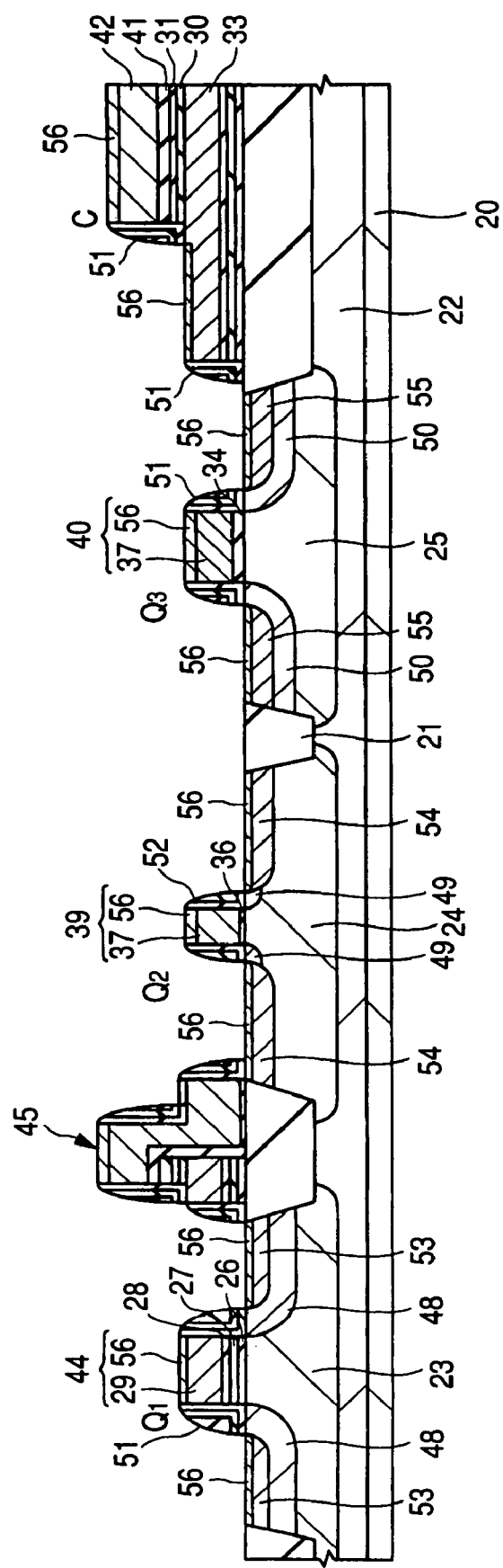
FIG. 18 is a cross-sectional view illustrating a manufacturing step of the semiconductor device following the step of FIG. 17.

As illustrated in FIG. 17, lightly-doped n type impurity diffusion regions 48 in alignment with the gate electrode 44 are then formed in the memory cell formation region by photolithography and ion implantation. The lightly-doped n type impurity diffusion regions 48 can be formed by introducing an n type impurity such as phosphorus or arsenic in the semiconductor substrate 20 and carrying out heat treatment for activating the n type impurity thus introduced. Similarly, lightly-doped n type impurity diffusion regions 49 in alignment with the gate electrode 39 are formed in the low breakdown voltage MISFET formation region, followed by the formation of lightly-doped n type impurity diffusion regions 50 in alignment with the gate electrode 40 in the high breakdown voltage MISFET formation region.

A film stack composed of a silicon oxide film, a silicon nitride film and a silicon oxide film is then formed over the semiconductor substrate 20. The film stack can be formed using, for example, CVD. The silicon oxide film formed in the uppermost layer is then removed by anisotropic etching. After this etching, the silicon oxide film of the uppermost layer remains over the side walls on both sides of each of the gate electrode, 39, 40 and 44.

A resist pattern is then formed over the semiconductor substrate 20. The resist pattern has been patterned so as to cover the memory cell formation region and high breakdown voltage MISFET formation region therewith and expose therefrom the low breakdown voltage MISFET formation region. By etching with this resist pattern as a mask, the silicon oxide film of the uppermost layer formed on the side walls of the gate electrode 39 is removed.

After removal of the resist pattern, anisotropic etching is performed to form sidewalls 51 and 52. By these steps, sidewalls 51 having a relatively large width can be formed on the side walls of the gate electrode 44 formed in the memory cell formation region and the sidewalls of the gate electrode 40 formed in the high breakdown voltage MISFET formation region. On the side walls of the gate electrode 39 formed in the low breakdown voltage MISFET formation region, sidewalls 52 which have a relatively small width can be formed.

Heavily-doped n type impurity diffusion regions 53 are then formed in the memory cell formation region by photolithography and ion implantation. The heavily-doped n type impurity diffusion regions 53 can be formed by introducing an n type impurity such as phosphorus or arsenic in the semiconductor substrate 20 and then carrying out heat treatment for activating the n type impurity thus introduced. Similarly, heavily-doped n type impurity diffusion regions 54 are formed in the low breakdown voltage MISFET formation region and heavily-doped n type impurity diffusion regions 55 are formed in the high breakdown voltage MISFET formation region. These heavily-doped n type impurity diffusion regions 53 to 55 have an n type impurity doped at a higher concentration compared with the lightly-doped n type impurity diffusion regions 48 to 50.

A refractory metal film such as cobalt film is then formed over the entire surface of the semiconductor substrate 20. The cobalt film can be formed using, for example, sputtering or CVD. Heat treatment is then given to form a cobalt silicide film 56 over the gate electrodes 39, 40 and 44 and heavily-doped n type impurity diffusion regions 53 to 55. The cobalt silicide film 56 is formed in order to reduce the resistance. Described specifically, the cobalt silicide film 56 can be formed over the gate electrodes 39, 40 and 44 and heavily-doped n type impurity diffusion regions 53 to 55 by depositing a cobalt film, carrying out heat treatment and then removing an unreacted portion of the cobalt. A titanium silicide film or nickel silicide film can be formed using a titanium film or nickel film instead of the cobalt film as the refractory metal film. The cobalt silicide film 56 is formed also over the exposed surfaces of the lower electrode 33 and upper electrode 42 formed in the capacitor element formation region.

In the above-described manner, the MONOS transistor Q1 can be formed in the memory cell formation region. Similarly, the low breakdown voltage MISFET Q2 is formed in the low breakdown voltage MISFET formation region and the high breakdown voltage MISFET Q3 is formed in the high breakdown voltage MISFET formation region. In addition, a capacitor element C can be formed in the capacitor element formation region.

A wiring step will next be described. As illustrated in FIG. 3, a silicon nitride film 57 is formed over the main surface of the semiconductor substrate 20. The silicon nitride film 57 can be formed, for example, by CVD. A silicon oxide film 58 is then formed over the silicon nitride film 57. This silicon oxide film 58 can also be formed using, for example, CVD. The surface of the silicon oxide film 58 is then planarized using, for example, CMP (Chemical Mechanical Polishing).

Contact holes 59 are then formed in the silicon oxide film 58 by photolithography and etching. A titanium/titanium nitride film is formed over the silicon oxide film 58 including the bottom surface and inside walls of the contact holes 59. The titanium/titanium nitride film is a film stack of a titanium film and a titanium nitride film and it can be formed, for example, by sputtering. This titanium/titanium nitride film has so-called barrier properties so that it can prevent the diffusion of, for example, tungsten, which is a material of a film to be buried in the later step, into silicon.

A tungsten film is then formed over the entire surface of the semiconductor substrate 20 in order to bury it in the contact holes 59. The tungsten film can be formed using, for example, CVD. An unnecessary portion of the titanium/titanium nitride film and tungsten film formed over the silicon oxide film 58 is then removed by CMP to form plugs 60.

A titanium/titanium nitride film, aluminum film and titanium/titanium nitride film are successively formed over the silicon oxide film 58 and plugs 60. These films can be formed using, for example, sputtering. These films are then patterned by photolithography and etching, whereby interconnects 61 are formed. Upper-level interconnects are formed over these interconnects 61, but the description on them is omitted here. In such a manner, the semiconductor device of Embodiment 1 can be formed.

Embodiment 2

In Embodiment 1, when the gate electrode 39 of the low breakdown voltage MISFET and the gate electrode 40 of the high breakdown voltage MISFET are formed, all of the gate insulating film 34, polysilicon film 37 and cap insulating film 38 are removed from the memory cell formation region. In Embodiment 2, on the other hand, described is an example of leaving the gate insulating film 34, polysilicon film 37 and cap insulating film 38 in the MONOS transistor formation region of the memory cell formation region when the gate electrodes 39 and 40 are formed.

Figure 19:
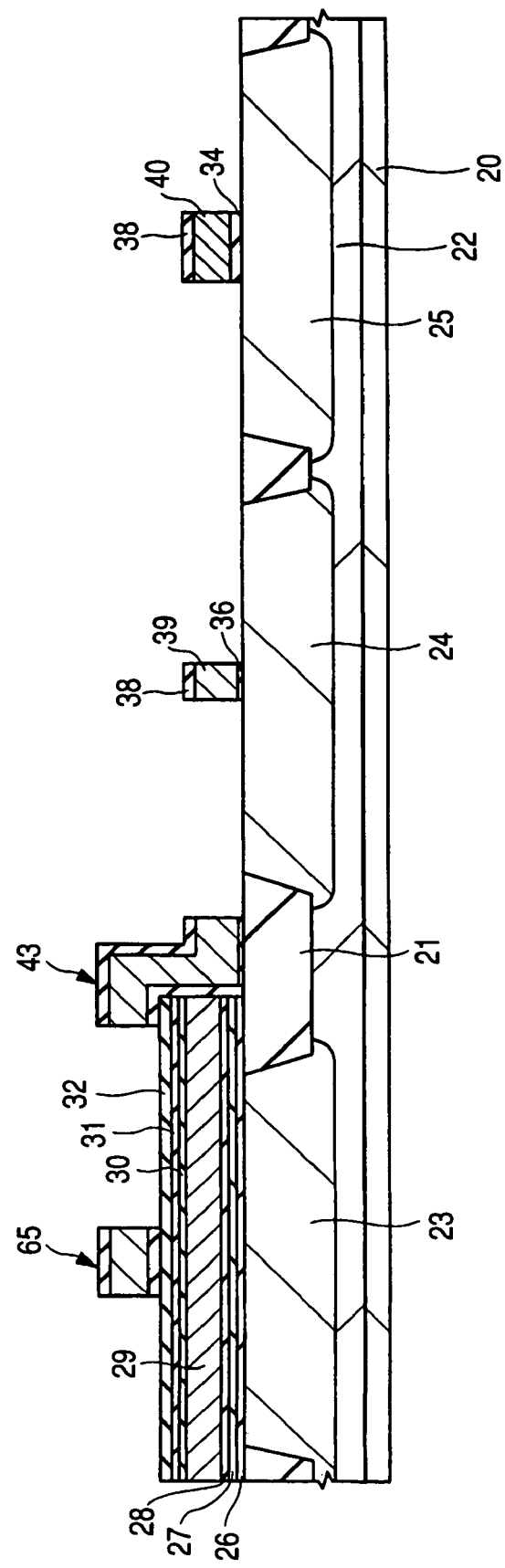
FIG. 19 is a cross-sectional view illustrating a manufacturing step of a semiconductor device according to Embodiment 2.

The manufacturing method of the semiconductor device according to Embodiment 2 is similar to that of Embodiment 1 in the steps illustrated in FIGS. 5 to 11. Then, as illustrated in FIG. 19, the gate electrode 39 and the gate electrode 40 are formed in the low breakdown voltage MISFET formation region and the high breakdown voltage MISFET formation region, respectively, by using photolithography and etching. At this time, a pattern 65 is formed in the gate electrode formation region of the MONOS transistor in the memory cell formation region. This pattern 65 is formed simultaneously with the gate electrodes 39 and 40. In Embodiment 1, when the gate electrodes 39 and 40 are formed, the memory cell formation region is patterned so as not to leave therein any of the gate insulating film 34, polysilicon film 37 and cap insulating film 38. In Embodiment 2, on the other hand, the memory cell formation region is patterned so as to leave the pattern 65 composed of the gate insulating film 34, polysilicon film 37 and cap insulating film 38 in the gate electrode formation region of the MONOS transistor.

A resist pattern which covers therewith the low breakdown voltage MISFET formation region, high breakdown voltage MISFET formation region and boundary region and exposes therefrom the memory cell formation region is formed. At this time, in the memory cell formation region, a hard mask composed of the pattern 65 is formed only over the gate electrode formation region. With the resist pattern as a mask and also with the pattern 65 as a hard mask, a gate electrode 44 of the MONOS transistor is formed in the memory cell formation region as illustrated in FIG. 14. Subsequent steps are similar to those of Embodiment 1. The semiconductor device of Embodiment 2 can be formed in such a manner.

Embodiment 2 can provide, as well as similar advantages to those available in Embodiment 1, an advantage as described below. Described specifically, in Embodiment 2, the gate electrode 39 is formed in the low breakdown voltage MISFET formation region and the gate electrode 40 is formed in the high breakdown voltage MISFET formation region. Simultaneously with them, the pattern 65 is formed in the memory cell formation region. This means that the gate electrodes 39 and 40 and pattern 65 are patterned using one mask. The gate electrode 40 of the MONOS transistor is formed with the pattern 65 as a hard mask. Accordingly, the gate electrodes 39 and 40 and the gate electrode 44 have virtually been patterned using one mask so that almost no misalignment exists between the gate electrodes 39 and 40, and the gate electrode 44.

If the pattern 65 is not used as a hard mask, a resist pattern different from that used for the formation of the gate electrodes 39 and 40 is used instead for the formation of the gate electrode 44. This means that masks used for the formation of the gate electrode 44 and the gate electrodes 39 and 40 are different, which may easily cause misalignment between the gate electrode 44 and the gate electrodes 39 and 40.

Contact holes 59 are then formed in a wiring step as described above in Embodiment 1 (refer to FIG. 3). The positions of these contact holes 59 have been determined with reference to the gate electrodes. This means that in a mask for the formation of the contact holes 59, alignment is performed with the patterns of the gate electrodes as a reference layer. When the gate electrodes 39 and 40 are made using a mask different from that used for the gate electrode 44, alignment is performed with either one of the masks as a reference layer. The misalignment between the gate electrodes 39 and 40 and the gate electrode 44, if any, may cause misalignment between the gate electrode not used as the reference layer and the contact hole 59. This may lead to short-circuit faults between the gate electrode not used as the reference layer and the contact hole 59.

When as in Embodiment 2, with the pattern 65 formed simultaneously with the gate electrodes 39 and 40 as a hard mask, the gate electrode 44 is formed, the gate electrodes 39 and 40 and the gate electrode 44 seem to be formed via one mask. There is therefore less misalignment between the gate electrodes 39 and 40 and the gate electrode 44. It is therefore possible to minimize the misalignment between the gate electrode 44 and contact hole 59 by forming the contact hole 59 with the mask used for the formation of the gate electrodes 39 and 40 as a reference layer. Thus, by Embodiment 2, the misalignment between the gate electrodes 39, 40 and 44 and the contact hole 59 can be minimized and the production yield of the semiconductor device can be improved.

Embodiment 3

In Embodiment 1, described was an example of forming the gate electrode 44 of the MONOS transistor after formation of the gate electrode 39 of the low breakdown voltage MISFET and the gate electrode 40 of the high breakdown voltage MISFET. In Embodiment 3, an example of forming the gate electrode 44 of the MONOS transistor, followed by the formation of the gate electrode 39 of the low breakdown voltage MISFET and the gate electrode 40 of the high breakdown voltage MISFET will be described.

In Embodiment 3, the memory cell formation region corresponds to the second region, while the low breakdown voltage MISFET formation region and high breakdown voltage MISFET formation region correspond to the first region. In other words, the MONOS transistor corresponds to the second MISFET and the low breakdown voltage MISFET and high breakdown voltage MISFET correspond to the first MISFET.

Figure 20:
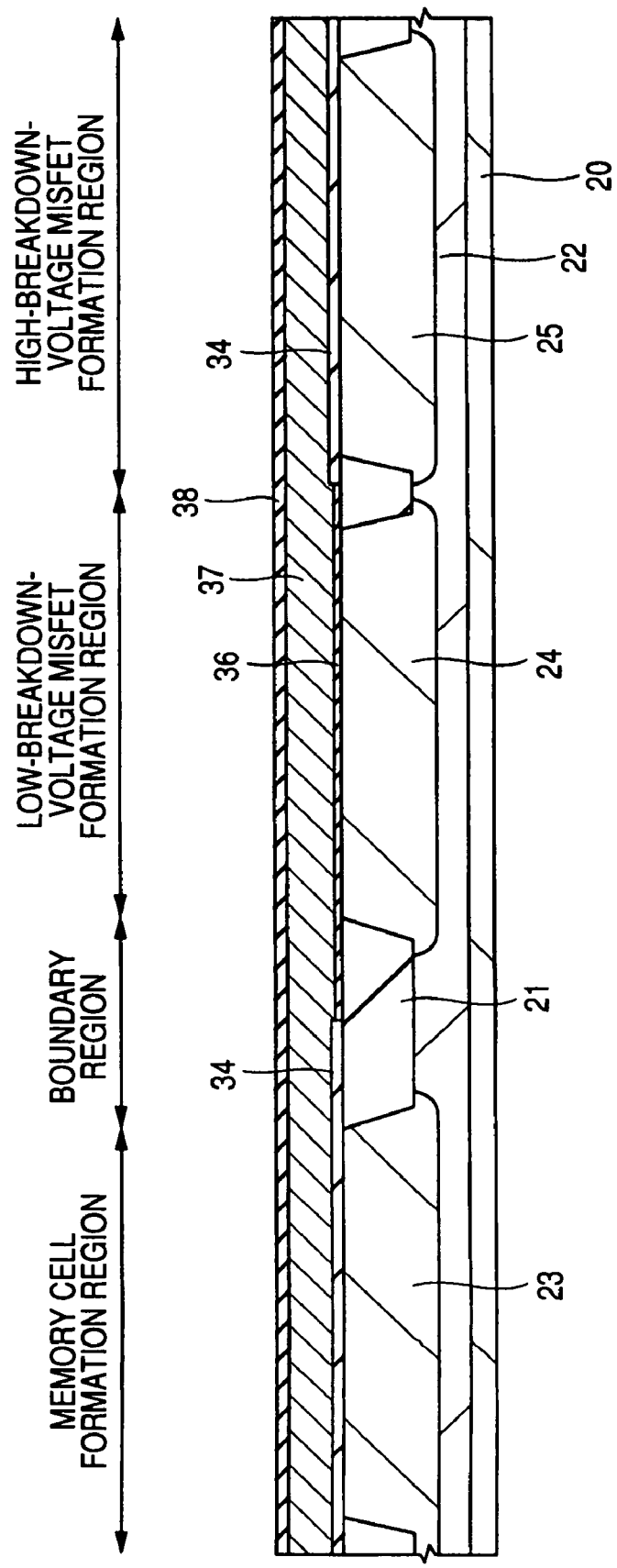
FIG. 20 is a cross-sectional view illustrating a manufacturing step of a semiconductor device according to Embodiment 3.

A step in the manufacturing method of the semiconductor device according Embodiment 3 is similar to the step shown in FIG. 5 of Embodiment 1. Then, as illustrated in FIG. 20, a gate insulating film (first insulating film) 36 which is relatively thin is formed in the low breakdown voltage MISFET formation region, while a gate insulating film (first insulating film) 34 which is relatively thick is formed in the high breakdown voltage MISFET formation region. A method of forming the relatively thin gate insulating film 36 and the relatively thick gate insulating film 34 is similar to that employed in Embodiment 1. The gate insulating films 34 and 36 can be made of, for example, a silicon oxide film. The relatively thick gate insulating film 34 has also been formed in the memory cell formation region. A polysilicon film (first conductor film) 37 is formed over the semiconductor substrate 20 and then, a cap insulating film 38 is formed over the polysilicon film 37.

Figure 21:
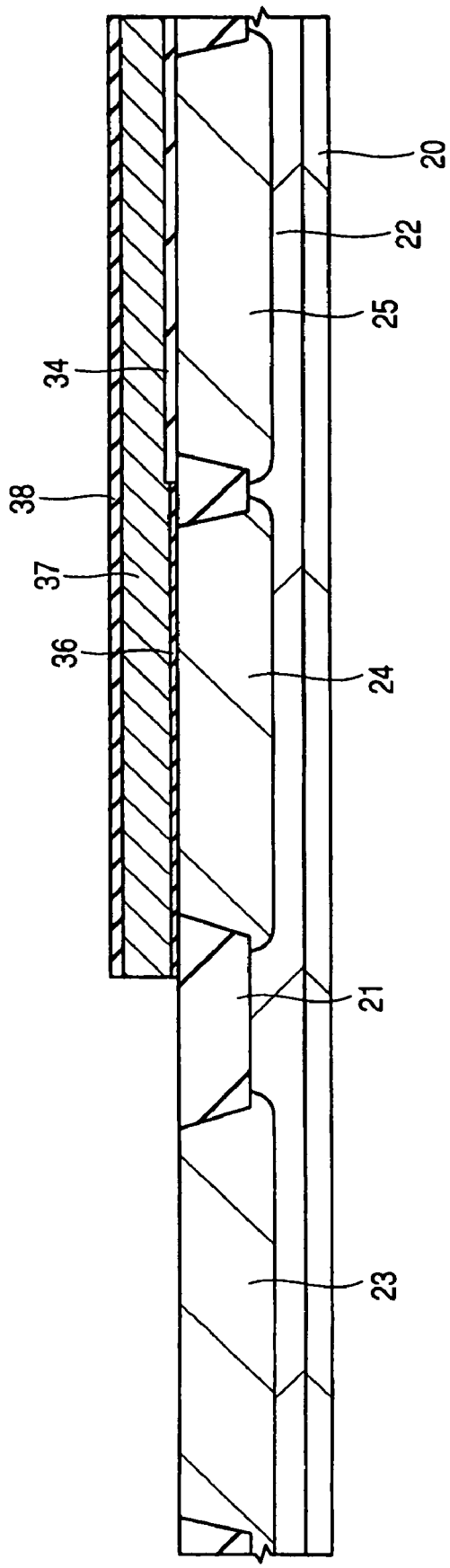
FIG. 21 is a cross-sectional view illustrating a manufacturing step of the semiconductor device following the step of FIG. 20.

As illustrated in FIG. 21, the gate insulating film 34, polysilicon film 37 and cap insulating film formed in the memory cell formation region are then removed by photolithography and etching. A resist pattern used for this step has been patterned so as to cover the low breakdown voltage MISFET formation region and high breakdown voltage MISFET formation region and expose the memory cell formation region. As a mask for forming this resist pattern, the mask used for the formation of the channel formation region in the semiconductor substrate 20 in the memory cell formation region can be used, because the mask for the formation of the channel formation region has also been patterned so as to cover the low breakdown voltage MISFET formation region and high breakdown voltage MISFET formation region and expose the memory cell formation region. Even if the step of FIG. 21 is added, an increase in the number of masks is not necessary. This leads to a reduction in the manufacturing cost of the semiconductor device.

Figure 22:
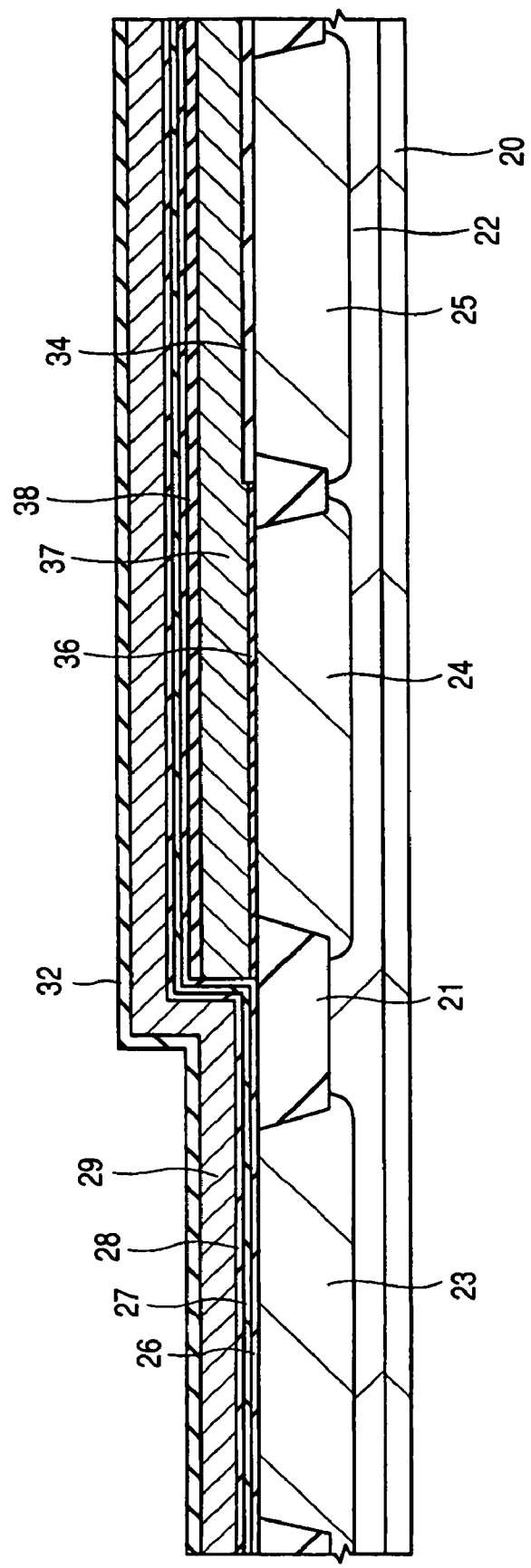
FIG. 22 is a cross-sectional view illustrating a manufacturing step of the semiconductor device following the step of FIG. 21.

As illustrated in FIG. 22, a gate insulating film (first potential barrier film) 26 is formed over the main surface of the semiconductor substrate 20. The gate insulating film 26 is made of, for example, a silicon oxide film and can be formed by thermal oxidation. A charge storage film 27 is then formed over the gate insulating film 26. The charge storage film 27 is made of, for example, a silicon nitride film and can be formed using CVD (Chemical Vapor Deposition) in which chemical reaction is effected between a silane gas ($SiH_4$) and an ammonia gas ($NH_3$). The charge storage film 27 is not limited to a silicon nitride film, but may be a film having a trap level therein, for example, silicon oxynitride film (SiON).

An insulating film (second potential barrier film) 28 is then formed over the charge storage film 27. The insulating film 28 is made of, for example, a silicon oxide film and can be formed using CVD in which chemical reaction is effected between a silane gas ($SiH_4$) and an oxygen gas ($O_2$). An insulating film stack (ONO film, second insulating film) composed of the gate insulating film 26, charge storage film 27 and insulating film 28 is thus formed.

A polysilicon film (second conductor film) 29 is then formed over the insulating film 28. The polysilicon film 29 can be formed, for example, by CVD in which thermal decomposition of a silane gas is performed in a nitrogen gas ($N_2$). When the polysilicon film 29 is formed, a conductive impurity such as phosphorus may be added. Alternatively, a conductive impurity may be injected into the polysilicon film by ion implantation after the completion of the formation of the polysilicon film 29.

Over the polysilicon film 29, a film stack composed of a silicon oxide film 30, a silicon nitride film 31 and a cap insulating film 32 is formed. The cap insulating film 32 is made of, for example, a silicon oxide film. The film stack can be formed using, for example, CVD. The cap insulating film 32 has a function of protecting a gate electrode 44 which will be formed in the later step.

Figure 23:
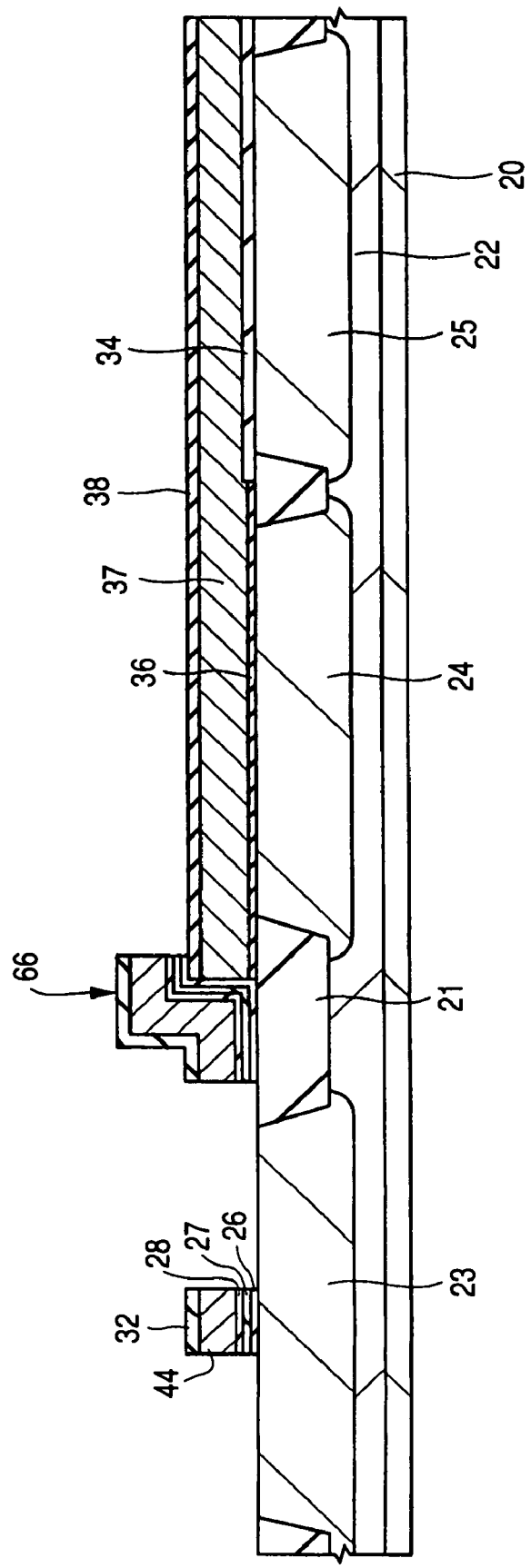
FIG. 23 is a cross-sectional view illustrating a manufacturing step of the semiconductor device following the step of FIG. 22.

As illustrated in FIG. 23, the gate electrode (second gate electrode) 44 of the MONOS transistor is formed in the memory cell formation region by photolithography and etching. Upon etching, the gate insulating film 26, charge storage film 27, insulating film 28, polysilicon film 29 and cap insulating film 32 formed over the memory cell formation region are removed. By this patterning, a dummy pattern 66 remains in a boundary region between the memory cell formation region and low breakdown voltage MISFET formation region.

Then, a resist pattern is formed over the semiconductor substrate 20. The resist pattern has been patterned so as to cover therewith the memory cell formation region and boundary region. The resist pattern also covers the gate electrode formation region in the low breakdown voltage MISFET formation region and the gate electrode formation region in the high breakdown voltage MISFET formation region. The other regions in the low breakdown voltage MISFET formation region and high breakdown voltage MISFET formation region are exposed.

Figure 24:
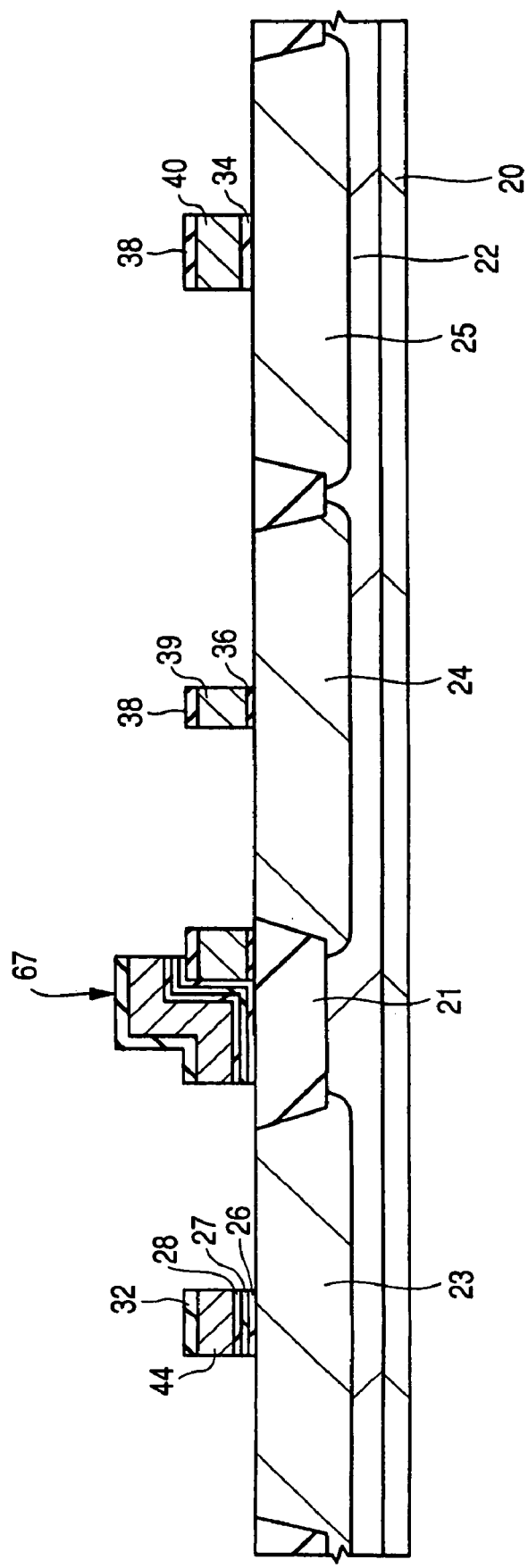
FIG. 24 is a cross-sectional view illustrating a manufacturing step of the semiconductor device following the step of FIG. 23.

As illustrated in FIG. 24, by etching with the resist pattern as a mask, a gate electrode (first gate electrode) 39 is formed in the low breakdown voltage MISFET formation region and a gate electrode (first gate electrode) 40 is formed in the high breakdown voltage MISFET formation region. At this time, a dummy pattern 67 is formed in the boundary region between the memory cell formation region and low breakdown voltage MISFET formation region.

In such a manner, the gate electrode 44 of the MONOS transistor can be formed in the memory cell formation region. Further, the gate electrode 39 of the low breakdown voltage MISFET and gate electrode 40 of the high breakdown voltage MISFET can be formed in the low breakdown voltage MISFET formation region and in the high breakdown voltage MISFET formation region, respectively. Subsequent steps are similar to those of Embodiment 1.

According to Embodiment 3, advantages similar to those of Embodiment 1 are available. For example, generation of bird's beaks can be suppressed in any of the MONOS transistor formed in the memory cell formation region, low breakdown voltage MISFET formed in the low breakdown voltage MISFET formation region, and high breakdown voltage MISFET formed in the high breakdown voltage MISFET formation region so that the reliability of the resulting semiconductor device can have improved.

Embodiment 4

In Embodiment 3, when the gate electrode 44 of the MONOS transistor was formed, all of the gate insulating film 26, charge storage film 27, insulating film 28, polysilicon film 29 and cap insulating film 32 were removed from the low breakdown voltage MISFET formation region and high breakdown voltage MISFET formation region, as illustrated in FIG. 23. In Embodiment 4, an example of leaving the gate insulating film 26, charge storage film 27, insulating film 28, polysilicon film 29 and cap insulating film 32 in the gate electrode formation region in the low breakdown voltage MISFET formation region and high breakdown voltage MISFET formation region will be described.

Figure 25:
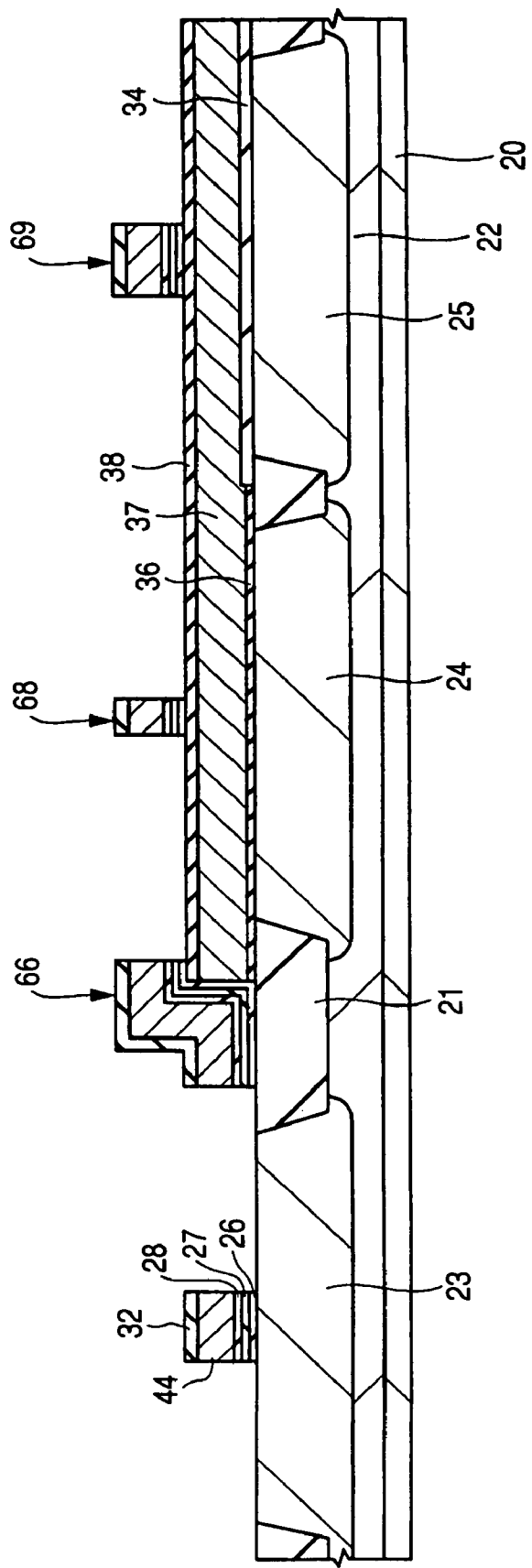
FIG. 25 is a cross-sectional view illustrating a manufacturing step of a semiconductor device according to Embodiment 4.

Steps of the manufacturing method of the semiconductor device according to Embodiment 4 are similar to those of Embodiment 3 illustrated in FIGS. 20 to 22. Then, as illustrated in FIG. 25, a gate electrode 44 is formed in the memory cell formation region by using photolithography and etching. At this time, patterns 68 and 69 are formed in the gate electrode formation regions of the low breakdown voltage MISFET formation region and high breakdown voltage MISFET formation region, respectively. These patterns 68 and 69 are formed simultaneously with the formation of the gate electrode 44.

A resist pattern which covers the memory cell formation region and boundary region and exposes the low breakdown voltage MISFET formation region and high breakdown voltage MISFET formation region is formed. When the resist pattern is formed, patterns 68 and 69 are formed as hard masks only over the gate electrode formation regions in the low breakdown voltage MISFET formation region and high breakdown voltage MISFET formation region, respectively. With the resist pattern as a mask and the patterns 68 and 69 as hard masks, the gate electrode 39 is formed in the low breakdown voltage MISFET formation region and gate electrode 40 is formed in the high breakdown voltage MISFET formation region. Steps subsequent thereto are similar to those of Embodiment 1. The semiconductor device according to Embodiment 4 can be manufactured in such a manner.

By Embodiment 4, both an advantage similar to that of Embodiment 1 and advantage similar to that of Embodiment 2 are available. In other words, since patterns 68 and 69 formed simultaneously with the gate electrode 44 are used as hard masks for the formation of the gate electrodes 39 and 40, misalignment between the gate electrodes 39, 40 and 44 and contact holes 59 can be minimized. A production yield of the semiconductor device can therefore be improved.

Embodiment 5

In Embodiment 5, an example of forming an MISFET having a gate electrode made of a metal film and an MISFET having a gate electrode made of a polysilicon film over one semiconductor substrate will be described.

Figure 26:
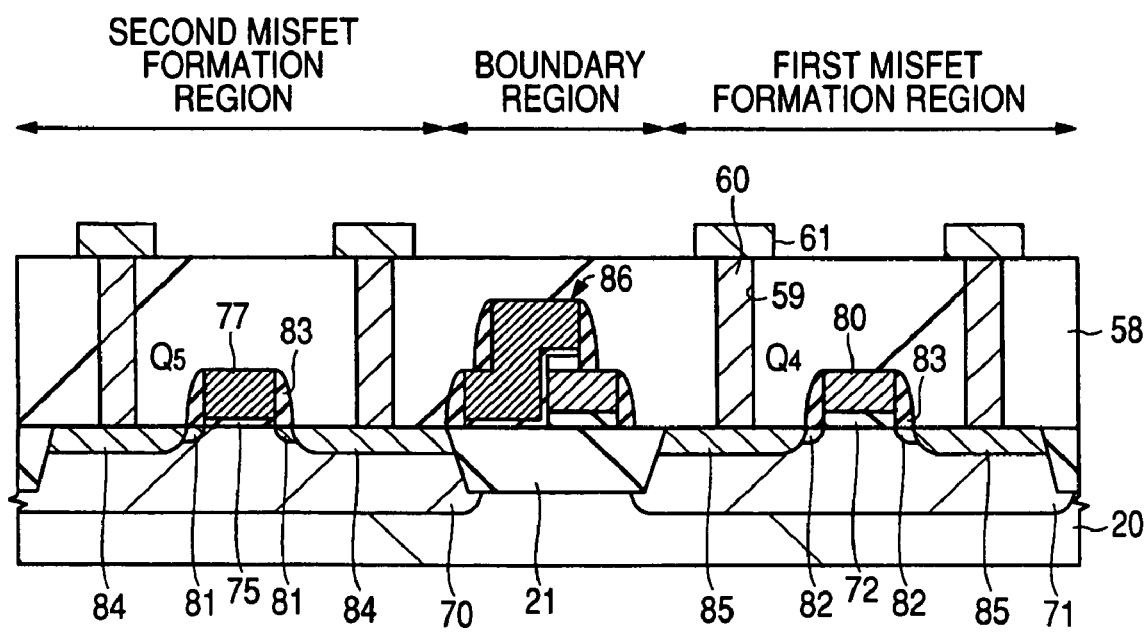
FIG. 26 is a cross-sectional view illustrating the cross-section of a semiconductor device according to Embodiment 5.

FIG. 26 is a cross-sectional view illustrating the semiconductor device according to Embodiment 5. In FIG. 26, element isolation regions 21 have been formed over the semiconductor substrate 20 made of single crystal silicon and by these element isolation regions 21, a first MISFET formation region has been isolated from a second MISFET formation region.

In the first MISFET formation region in the semiconductor substrate 20, a p well 71 has been formed and over this p well 71, a first MISFET Q4 has been formed. The constitution of this first MISFET Q4 will next be described. Over the p well 71, a gate insulating film 72 made of, for example, a silicon oxide film has been formed. A gate electrode 80 has been formed over the gate insulating film 72. The gate electrode 80 has been made of, for example, a polysilicon film. The gate insulating film 72 of the first MISFET Q4 has a greater thickness than the gate insulating film 75 of a second MISFET Q5 which will be described later. In short, the gate insulating film 72 of the first MISFET Q4 and the gate insulating film 75 of the second MISFET Q5 are different in film thickness and the gate insulating film 72 has been relatively thicker.

Over the side walls of the gate electrode 80, sidewalls 83 made of, for example, a silicon oxide film have been formed. In the semiconductor substrate 20 directly below these sidewalls 83, lightly-doped n type impurity diffusion regions 82 which are semiconductor regions have been formed. Outside of the lightly-doped n type impurity diffusion regions 82, heavily-doped n type impurity diffusion regions 85 have been formed. In the heavily-doped n type impurity diffusion regions 85, an n type impurity such as phosphorus or arsenic has been doped at a higher concentration than that in the lightly-doped n type impurity diffusion regions 82. Source regions of the first MISFET Q4 have been composed of the lightly-doped n type impurity diffusion region 82 and heavily-doped n type impurity diffusion region 85. Drain regions have been also composed of the lightly-doped n type impurity diffusion region 82 and heavily-doped n type impurity diffusion region 85.

The first MISFET Q4 is an element mainly used when higher breakdown voltage is required compared with the second MISFET Q5 and it is operated at a relatively high drive voltage. The second MISFET Q5 is, on the other hand, an element mainly used when high speed operation is required compared with the first MISFET Q4 and is driven at a relatively low drive voltage.

The constitution of the second MISFET Q5 will next be described. In the second MISFET formation region in the semiconductor substrate 20, a p well 70 has been formed and the p well 70 has thereover the gate insulating film 75. The gate insulating film 75 has been thicker than the gate insulating film 72 of the first MISFET Q4 and has been made of, for example, a silicon oxide film.

Over the gate insulating film 75, a gate electrode 77 has been formed. A polysilicon film has conventionally been used as a material of the gate electrode 77. Owing to the recent miniaturization of MISFETs, however, the gate insulating film 75 has been thinner and depletion of the gate electrode 77 made of a polysilicon film has become too large to be ignored. Although the gate insulating film 75 made of a silicon oxide film must be thinned to obtain minute MISFETs, parasitic capacitance generated in the gate electrode due to the depletion of the gate electrode becomes too large to be ignored. The material of the gate electrode 75 has been therefore replaced by a metal film. Examples of the metal constituting the metal film include tantalum, tantalum nitride, zirconium, hafnium, platinum, ruthenium, ruthenium oxide, iridium, nickel and cobalt.

On the side walls of the gate electrode 77, sidewalls 83 made of, for example, a silicon oxide film have been formed. In the semiconductor substrate 20 directly below the sidewalls 83, lightly-doped n type impurity diffusion regions 81 which are semiconductor regions have been formed. Outside of the lightly-doped n type impurity diffusion regions 81, heavily-doped n type impurity diffusion regions 84 have been formed. In the heavily-doped n type impurity diffusion regions 84, an n type impurity such as phosphorus or arsenic has been implanted at a higher concentration than that in the lightly-doped n type impurity diffusion regions 81. Source regions of the second MISFET Q5 have been composed of the lightly-doped n type impurity diffusion region 81 and heavily-doped n type impurity diffusion region 84. Drain regions have been also composed of the lightly-doped n type impurity diffusion region 81 and heavily-doped n type impurity diffusion region 84.

The semiconductor device in Embodiment 5 has been equipped with the first MISFET Q4 having the relatively thick gate insulating film 72 and the gate electrode 80 composed of a polysilicon film and the second MISFET Q5 having the relatively thin gate insulating film 75 and the gate electrode 77 composed of a metal film. In the boundary region between the first MISFET formation region and second MISFET formation region, a dummy pattern 86, a footprint of the manufacturing method of Embodiment 5, has been formed.

The semiconductor device of Embodiment 5 has the above-described constitution. The manufacturing method of the semiconductor device, which is characteristic of the present invention, will next be described with reference to accompanying drawings.

Figure 27:
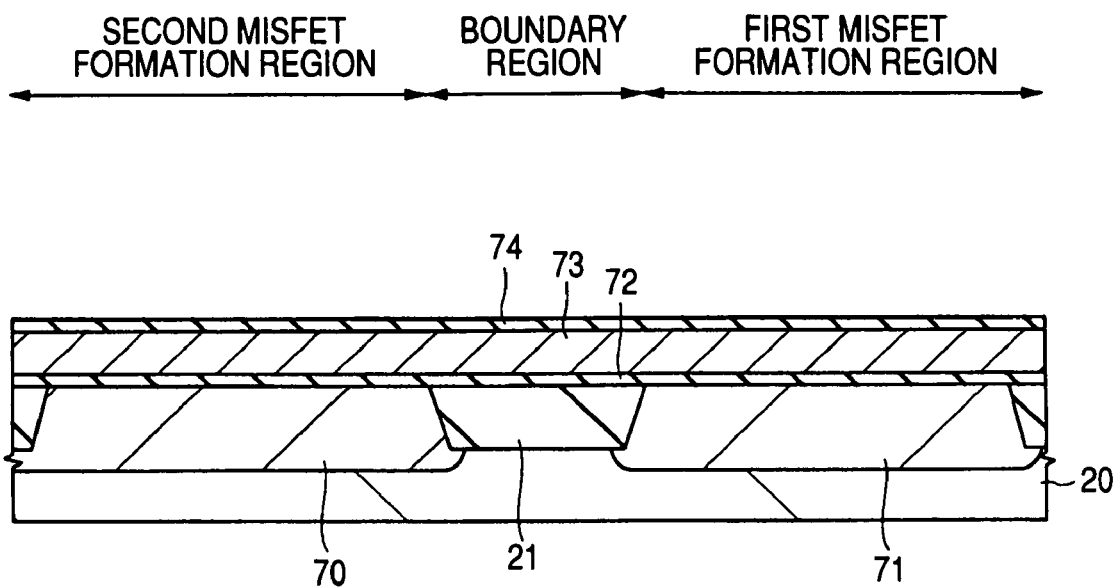
FIG. 27 is a cross-sectional view illustrating a manufacturing step of the semiconductor device according to Embodiment 5.

As illustrated in FIG. 27, the element isolation regions 21 and p wells 70 and 71 are formed over the semiconductor substrate 20 by using the known manufacturing technology.

The gate insulating film (first insulating film) 72 is then formed over the main surface of the semiconductor substrate. The gate insulating film 72 is made of, for example, a silicon oxide film and can be formed using, for example, thermal oxidation. A polysilicon film (first conductor film) 73 is formed over the gate insulating film 72, followed by the formation of a cap insulating film 74 over the polysilicon film 73. The cap insulating film 74 is made of, for example, a silicon oxide film and can be formed using, for example, CVD.

Figure 28:
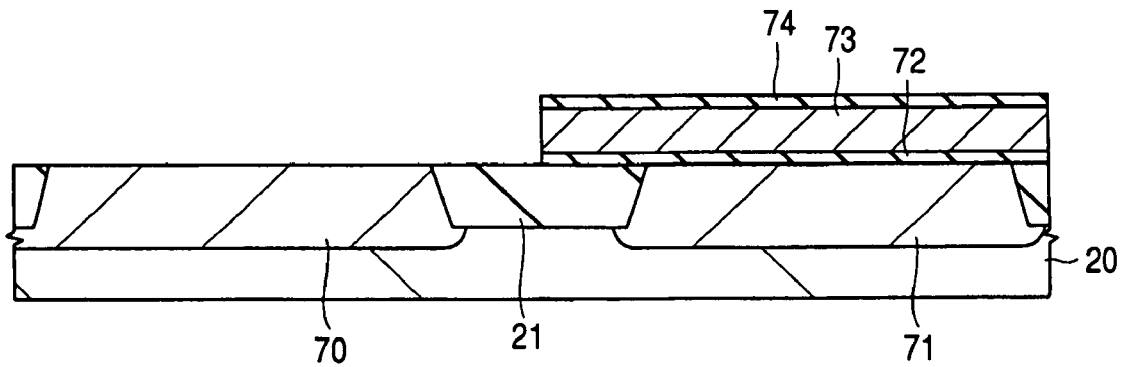
FIG. 28 is a cross-sectional view illustrating a manufacturing step of the semiconductor device following the step of FIG. 27.

As illustrated in FIG. 28, the gate insulating film 72, polysilicon film 73 and cap insulating film 74 are removed from the second MISFET formation region by photolithography and etching. In this step, fine processing for the formation of a gate electrode is not carried out in the first MISFET formation region and the gate insulating film 72, polysilicon film 73 and cap insulating film 74 remain all over the first MISFET formation region. This is one of the characteristics of the present invention. The processing for the formation of the gate electrode of the first MISFET in this step will lead to the generation of bird's beaks at the gate electrode of the first MISFET in the subsequent step of forming a gate insulating film of the second MISFET, resulting in deterioration in the characteristics of the first MISFET. In Embodiment 5, therefore, the gate electrode of the first MISFET is not formed prior to the formation of the gate insulating film of the second MISFET.

Figure 29:
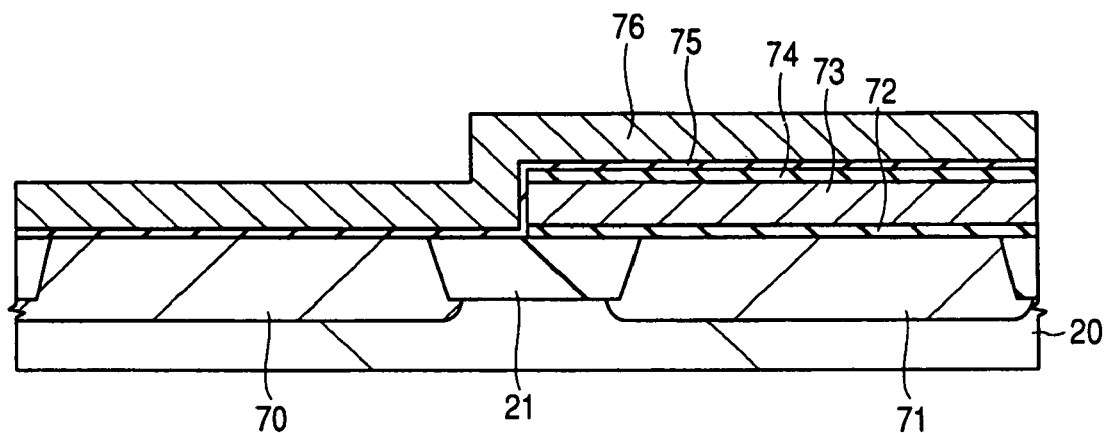
FIG. 29 is a cross-sectional view illustrating a manufacturing step of the semiconductor device following the step of FIG. 28.

As illustrated in FIG. 29, the gate insulating film (second insulating film) 75 is formed all over the surface of the semiconductor substrate 20. The gate insulating film 75 is made of, for example, a silicon oxide film and it has a smaller film thickness than the previously formed gate insulating film 72. Over the gate insulating film 75, a tantalum (second conductor film) film 76 is formed as a metal film. The tantalum film 76 can be formed using, for example, sputtering.

Figure 30:
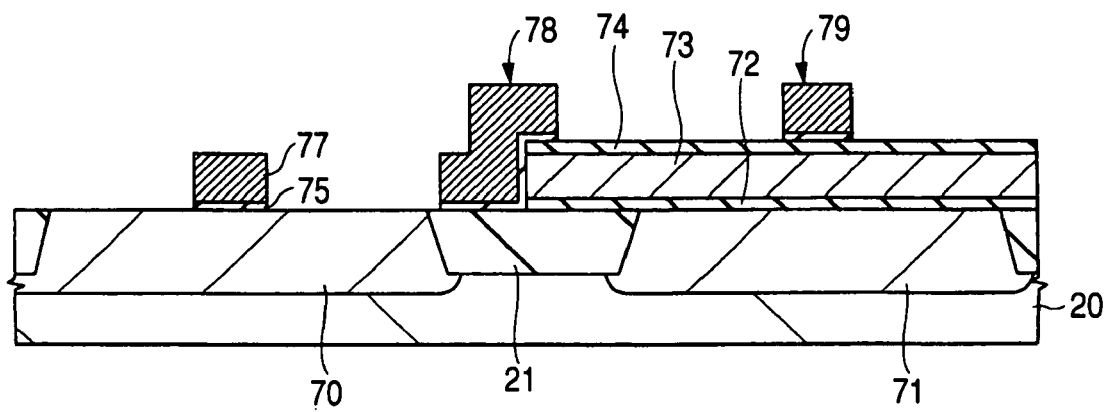
FIG. 30 is a cross-sectional view illustrating a manufacturing step of the semiconductor device following the step of FIG. 29.

As illustrated in FIG. 30, the gate electrode (second gate electrode) 77 is formed in the second MISFET formation region by photolithography and etching. At this time, a pattern 79 is formed in the gate electrode formation region of the first MISFET formation region. This pattern 79 is formed simultaneously with the gate electrode 77. In the boundary region, a dummy pattern 78 is formed.

Figure 31:
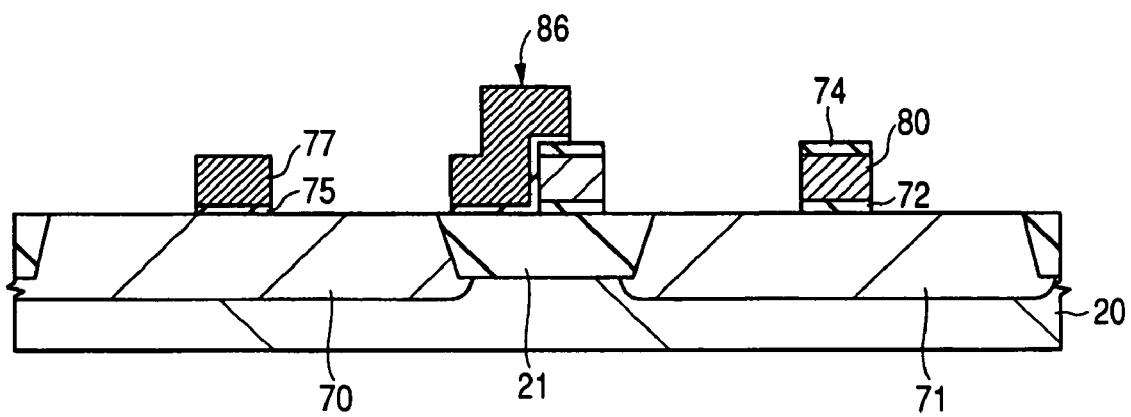
FIG. 31 is a cross-sectional view illustrating a manufacturing step of the semiconductor device following the step of FIG. 30.

A resist pattern for covering therewith the second MISFET formation region and boundary region and exposing therefrom the first MISFET formation region is formed. At this time, in the first MISFET formation region, a hard mask composed of the pattern 79 has been formed only over the gate electrode formation region. With the resist pattern as a mask and the pattern 79 as a hard mask, the gate electrode (first gate electrode) 80 is formed in the first MISFET formation region as illustrated in FIG. 31.

In the above-described manner, the gate electrode 80 made of a polysilicon film can be formed in the first MISFET formation region, while the gate electrode 77 made of a tantalum film can be formed in the second MISFET formation region. In the boundary, a dummy pattern 86 is formed.

In Embodiment 5, similar to Embodiment 1, the materials for the formation of the gate electrode 80 of the first MISFET and the gate electrode 77 of the second MISFET are formed prior to the fine processing thereof. After completion of the formation of the two gate electrode materials, fine processing for the formation of the gate electrodes 77 and 80 is carried out. The gate electrodes 77 and 80 are therefore free of bird's beaks, which will otherwise occur in the oxidation step and therefore, the reliability of the semiconductor device can be improved.

Similar to Embodiments 2 and 4, the pattern 79 formed simultaneously with the gate electrode 77 is used as a hard mask for the formation of the gate electrode 80 so that the misalignment between the gate electrodes 77 and 80 and the contact hole 59 can be minimized, resulting in improved production yield of the semiconductor device.

In Embodiment 5, the polysilicon film 73 is formed, followed by the formation of the tantalum film 76. Alternatively, the tantalum 76 may be formed, followed by the formation of the polysilicon film 73.

Embodiment 6

In Embodiment 6, an example of forming, over one semiconductor substrate, an n channel type MISFET having a gate electrode made of a metal film and a p channel MISFET having a gate electrode made of a metal film will be described. The first MISFET corresponds to the n channel MISFET, while the second MISFET corresponds to the p channel MISFET.

Figure 32:
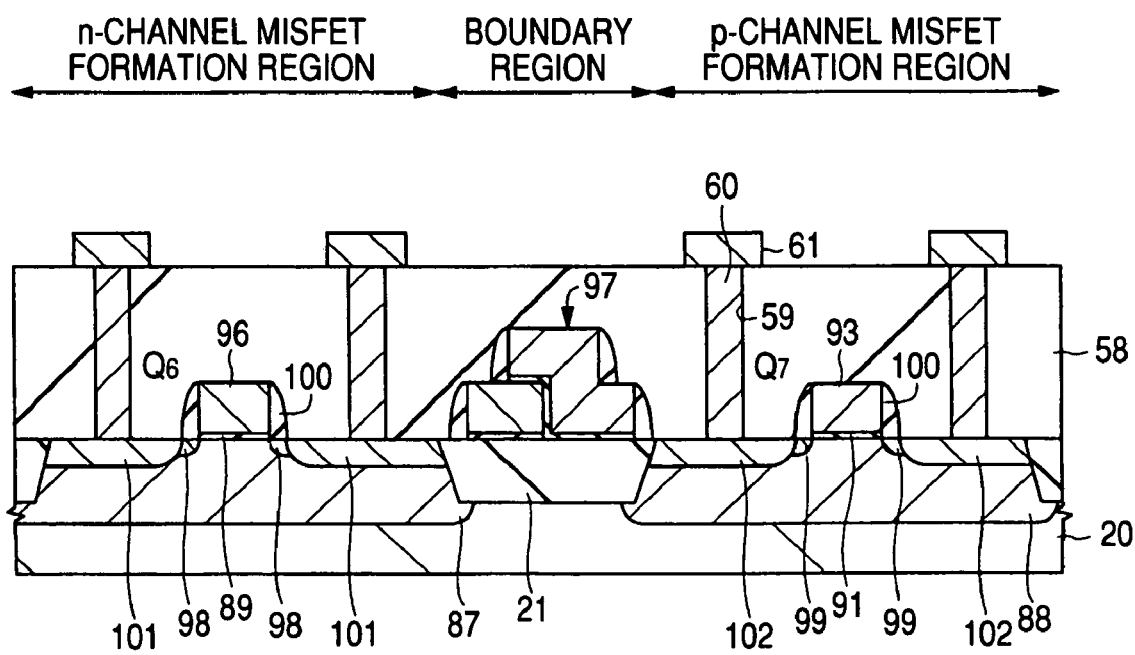
FIG. 32 is a cross-sectional view illustrating the cross-section of a semiconductor device according to Embodiment 6.

FIG. 32 is a cross-sectional view illustrating a semiconductor device of Embodiment 6. In FIG. 32, element isolation regions 21 have been formed over the semiconductor substrate 20 made of single crystal silicon. By these element isolation regions 21, an n channel MISFET formation region and a p channel MISFET formation region have been isolated.

In the n channel MISFET formation region in the semiconductor substrate 20, a p well 87 has been formed and over the p well 87, an n channel MISFET Q6 has been formed. The constitution of this n channel MISFET Q6 will next be described. Over the p well 87, a gate insulating film 89 has been formed and over this gate insulating film 89, a gate electrode 96 has been formed. The gate electrode 96 has been made of a metal film such as a tantalum film.

The gate insulating film 89 has been made of a high dielectric constant film having a higher dielectric constant than a silicon oxide film. A silicon oxide film has conventionally been used as the gate insulating film 89 because of its high breakdown voltage and excellent electrical and physical stability on a silicon-silicon oxide interface. As elements become finer, the gate insulating film 89 has been required to be ultrathin. Use of such a thin silicon oxide film as the gate insulating film 89 inevitably generates a so-called tunnel current, which is the flow of electrons through the channel of MISFET into a gate electrode, tunneling a barrier formed by the silicon oxide film.

In order to avoid this, a high dielectric constant film using a material having a higher dielectric constant than a silicon oxide film and therefore capable of increasing the physical film thickness in spite of the same capacity has been employed. Use of a high dielectric constant film can reduce a leak current because it can increase the physical film thickness without changing the capacity.

As the high dielectric constant film, the film of a hafnium aluminate (HfAlON) which is one of hafnium oxides is used. The hafnium aluminate film may be substituted by another hafnium insulating film such as hafnium oxide, HfON, HfSiO, HfSiON or HfAlO film. It is also possible to use a hafnium insulating film having an oxide such as tantalum oxide, niobium oxide, titanium oxide, zirconium oxide, lanthanum oxide or yttrium oxide introduced into the above-described hafnium insulating film. These hafnium insulating films are, similar to a hafnium aluminate film, have a higher dielectric constant than a silicon oxide film or silicon oxynitride film so that they can bring about similar effects to those available by the hafnium aluminate film.

On the side walls of the gate electrode 96, sidewalls 100 made of, for example, a silicon oxide film have been formed. In the semiconductor substrate 20 directly below the sidewalls 100, lightly-doped n type impurity diffusion regions 98 which are semiconductor regions have been formed. Outside the lightly-doped n type impurity diffusion regions 98, heavily-doped n type impurity diffusion regions 101 have been formed. In these heavily-doped n type impurity diffusion regions 101, an n type impurity such as phosphorus or arsenic has been introduced at a higher concentration than that in the lightly-doped n type impurity diffusion regions 98. The lightly-doped n type impurity diffusion region 98 and heavily-doped n type impurity diffusion region 101 have constituted the source region of the n channel MISFET Q6. The drain region has also been constructed from the lightly-doped n type impurity diffusion region 98 and heavily-doped n type impurity diffusion region 101.

The constitution of a p channel MISFET Q7 will next be described. In the p channel MISFET formation region in the semiconductor substrate 20, an n well 88 has been formed and over the n well 88, a gate insulating film 91 has been formed. The gate insulating film 9 has been made of, for example, a high dielectric constant film having a higher dielectric constant than that of a silicon oxide film. Over the gate insulating film 91, a gate electrode 93 has been formed. The gate electrode 93 has been made of, for example, a platinum film.

On the side walls of the gate electrode 93, sidewalls 100 made of, for example, a silicon oxide film have been formed. In the semiconductor substrate 20 directly below the sidewalls 100, lightly-doped p type impurity diffusion regions 99 which are semiconductor regions have been formed. Outside the lightly-doped p type impurity diffusion regions 99, heavily-doped p type impurity diffusion regions 102 have been formed. In these heavily-doped p type impurity diffusion regions 102, a p type impurity such as boron has been introduced at a higher concentration than that in the lightly-doped p type impurity diffusion regions 99. The lightly-doped p type impurity diffusion region 99 and heavily-doped p type impurity diffusion region 102 have constituted the source region of the p channel MISFET Q7. The drain region has also been constructed from the lightly-doped p type impurity diffusion region 99 and heavily-doped p type impurity diffusion region 102.

The semiconductor device of Embodiment 6 is equipped with the n channel MISFET Q6 having the gate insulating film 89 made of a high dielectric constant film and the gate electrode 96 made of a tantalum film and the p channel MISFET Q7 having the gate insulating film 91 made of a high dielectric constant film and gate electrode 93 made of a platinum film. In the boundary region between the n channel MISFET formation region and p channel MISFET formation region, a dummy pattern 97 which is a footprint of the manufacturing method of Embodiment 6 has been formed.

In Embodiment 6, a metal film has been used as the gate electrode material for each of the n channel MISFET Q6 and p channel MISFET Q7. The metal film is a tantalum film in the n channel MISFET Q6, while it is a platinum film in the p channel MISFET Q7. In short, the n channel MISFET Q6 and p channel MISFET Q7 use metal films different from each other. The reason will be explained next.

When a metal film is used as a gate electrode material, use of the same metal film for the n channel MISFET and p channel MISFET is considered as the first option.

When the same metal film is used for the gate electrodes of the n channel MISFET and p channel MISFET, however, a difference in the threshold voltage, which will be determined by the work function of the metal film, will appear between the n channel MISFET and p channel MISFET. The work function for decreasing the threshold voltage of the n channel MISFET is different from the work function for decreasing the threshold voltage of the p channel MISFET so that selection of a metal film having a work function capable of decreasing the threshold voltage of one of the MISFETs leads to an increase in the threshold voltage of the other MISFET.

In the n channel MISFET, when the work function of the gate electrode material is close to the conduction band of silicon, the threshold voltage of the n channel MISFET can be reduced. In this Embodiment 6, therefore, a tantalum film having a work function close to the conduction band of silicon is employed for the gate electrode 96. The tantalum film is used as the gate electrode material of the n channel MISFET. Not only it but also another metal film having a work function close to the conduction band of silicon can be used. A hafnium film, for example, may be used.

In the p channel MISFET, on the other hand, the threshold voltage thereof can be reduced when the gate material has a work function close to the valence band of silicon. In this Embodiment 6, therefore, a platinum film having a work function close to the valence band of silicon is used for the gate electrode 93. A platinum film is used as the gate electrode material of the p channel MISFET. Not only it but also another metal film having a work function close to the valence bond of silicon can be used. Examples may include ruthenium oxide and ruthenium.

In the semiconductor device according to Embodiment 6, a material having a work function more close to the conduction band of silicon is used for the gate electrode material of the n channel MISFET compared with the gate electrode material of the p channel MISFET. In other words, a material having a work function more close to the valence band of silicon is used for the gate electrode material of the p channel MISFET compared with the gate electrode material of the n channel MISFET.

A manufacturing method of the semiconductor device which is the characteristic of the present invention will next be described based on accompanying drawings.

Figure 33:
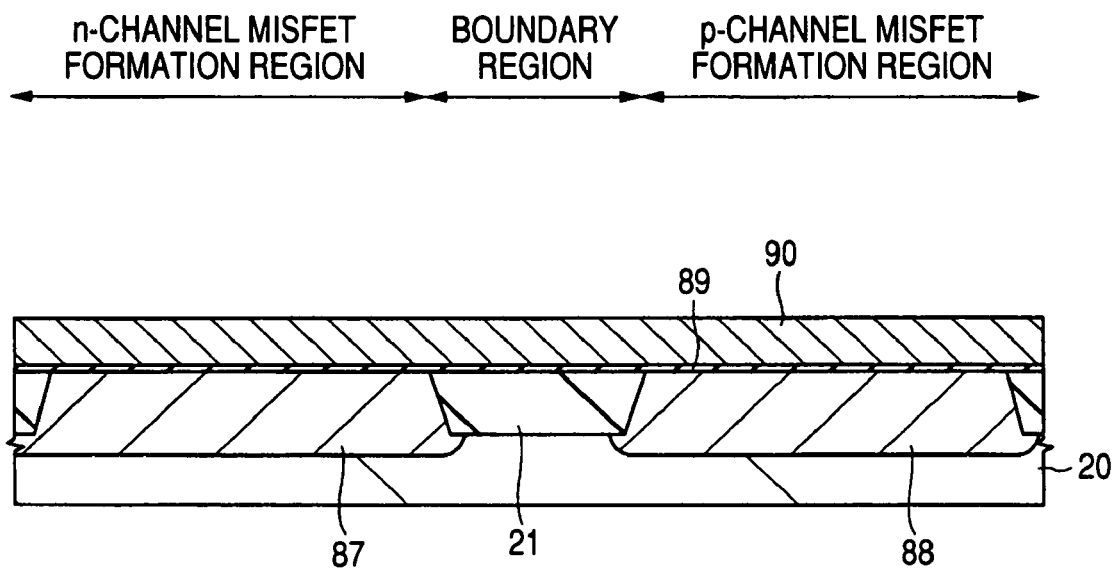
FIG. 33 is a cross-sectional view illustrating a manufacturing step of the semiconductor device according to Embodiment 6.

As illustrated in FIG. 33, element isolation regions 21, p well 87 and n well 88 are formed in the semiconductor substrate 20 by using a known manufacturing technology. The gate insulating film (first insulating film) 89 is then formed over the main surface of the semiconductor substrate. The gate insulating film 89 is made of, for example, a hafnium aluminate film and can be formed, for example, by CVD or ALD (Atomic Layer Deposition). Over the gate insulating film 89, a tantalum film (first conductor film) 90 is formed. The tantalum film 90 can be formed, for example, by sputtering.

Figure 34:
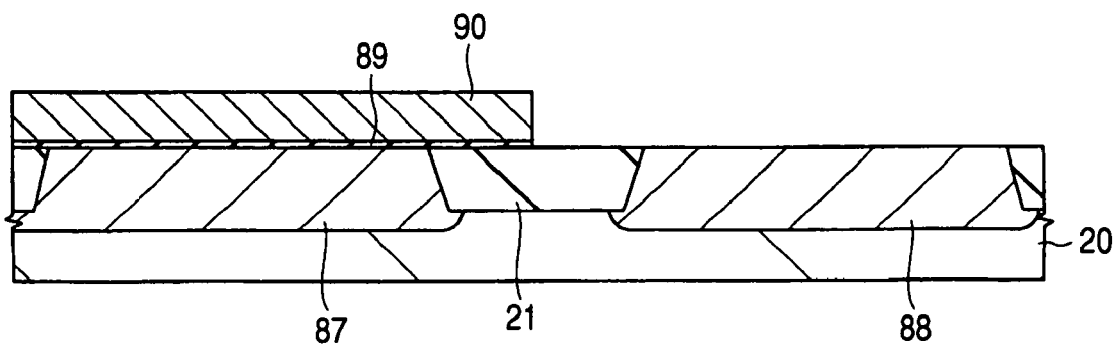
FIG. 34 is a cross-sectional view illustrating a manufacturing step of the semiconductor device following the step of FIG. 33.

As illustrated in FIG. 34, the gate insulating film 89 and tantalum film 90 are removed from the p channel MISFET formation region by photolithography and etching. In this step, the fine processing for the formation of the gate electrode is not performed in the n channel MISFET formation region so that the gate insulating film 89 and tantalum film 90 have remained all over the n channel MISFET formation region, which is one of the characteristics of the present invention. If the processing for the formation of the gate electrode of the n channel MISFET is carried out, bird's beaks may appear in the n channel MISFET during the subsequent step of forming a gate insulating film of the p channel MISFET and deterioration in the characteristics of the n channel MISFET occur. In Embodiment 6, the gate electrode of the n channel MISFET is not formed prior to the formation of the gate insulating film of the p channel MISFET.

Figure 35:
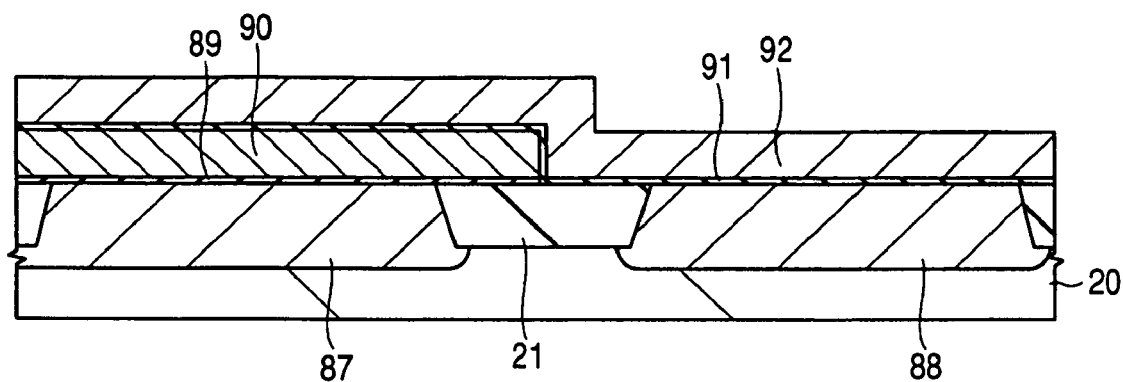
FIG. 35 is a cross-sectional view illustrating a manufacturing step of the semiconductor device following the step of FIG. 34.

As illustrated in FIG. 35, the gate insulating film (second insulating film) 91 is formed over the entire surface of the semiconductor substrate 20. The gate insulating film 91 is made of, for example, a hafnium aluminate film. A platinum (second conductor film) 92 is then formed over the gate insulating film 91. The platinum film 76 can be formed, for example, by sputtering or CVD.

Figure 36:
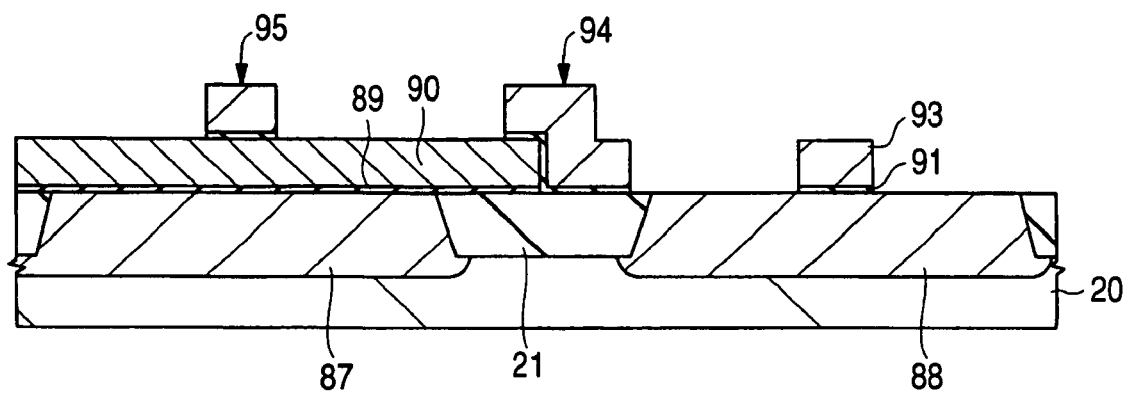
FIG. 36 is a cross-sectional view illustrating a manufacturing step of the semiconductor device following the step of FIG. 35.

As illustrated in FIG. 36, a gate electrode (second gate electrode) 93 is formed in the p channel MISFET formation region by photolithography and etching. At this time, a pattern 95 is formed in the gate formation region of the n channel MISFET formation region. This pattern 95 is formed simultaneously with the gate electrode 93. In the boundary region, a dummy pattern 94 is formed.

Figure 37:
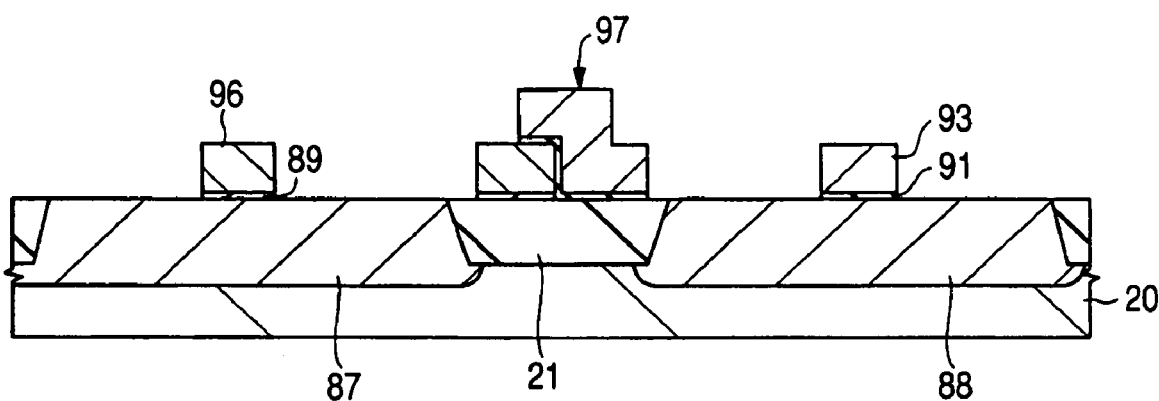
FIG. 37 is a cross-sectional view illustrating a manufacturing step of the semiconductor device following the step of FIG. 36.
Figure 38:
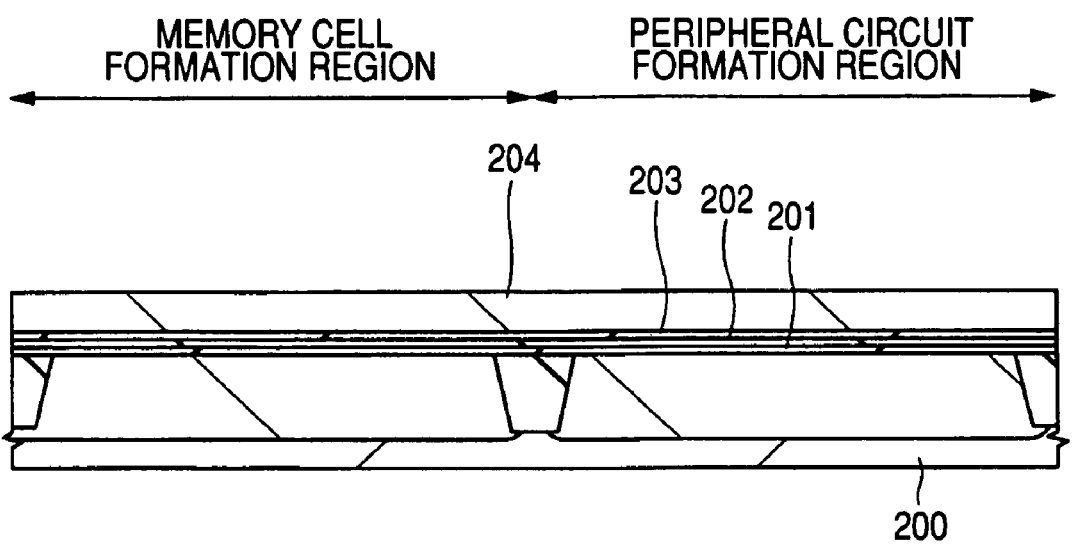
FIG. 38 is a cross-sectional view illustrating a manufacturing step of a semiconductor device investigated by the present inventor.
Figure 39:
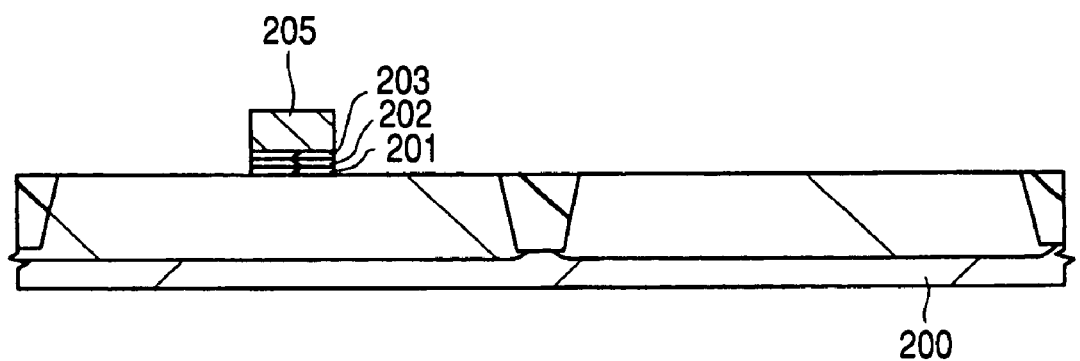
FIG. 39 is a cross-sectional view illustrating a manufacturing step of the semiconductor device following the step of FIG. 38.
Figure 40:
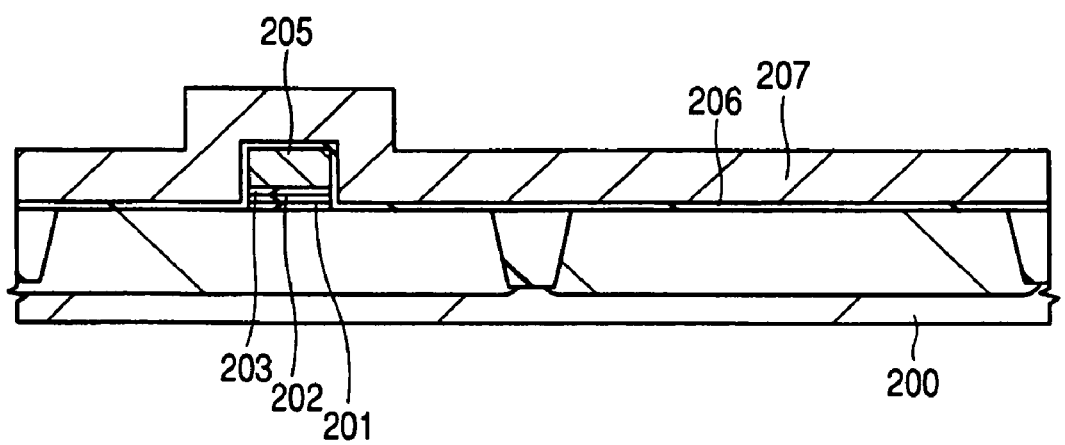
FIG. 40 is a cross-sectional view illustrating a manufacturing step of the semiconductor device following the step of FIG. 39.
Figure 41:
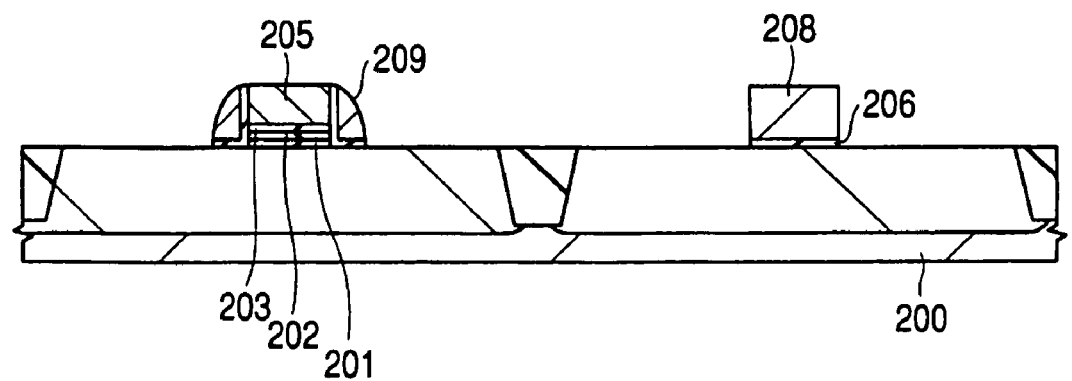
FIG. 41 is a cross-sectional view illustrating a manufacturing step of the semiconductor device following the step of FIG. 40.
Figure 42:
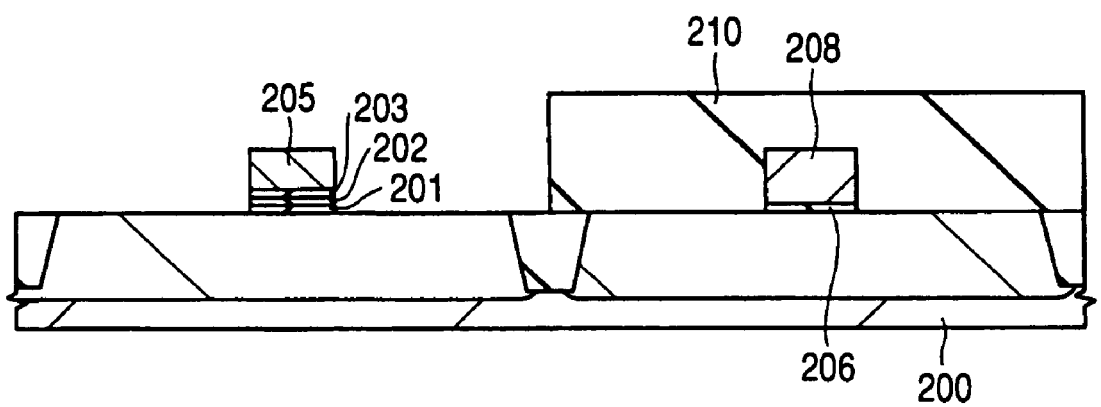
FIG. 42 is a cross-sectional view illustrating a manufacturing step of the semiconductor device following the step of FIG. 41.
Figure 43:
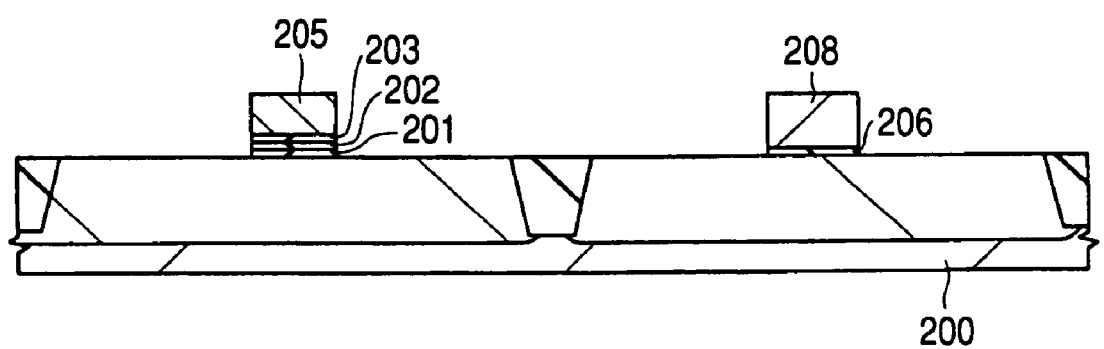
FIG. 43 is a cross-sectional view illustrating a manufacturing step of the semiconductor device following the step of FIG. 42.
Figure 44:
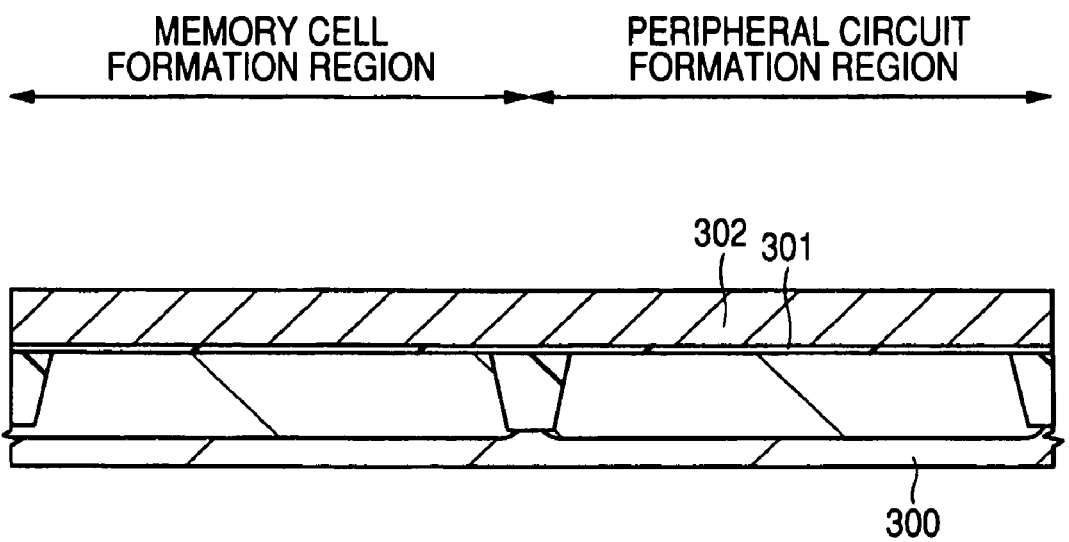
FIG. 44 is a cross-sectional view illustrating a manufacturing step of another semiconductor device investigated by the present inventor.
Figure 45:
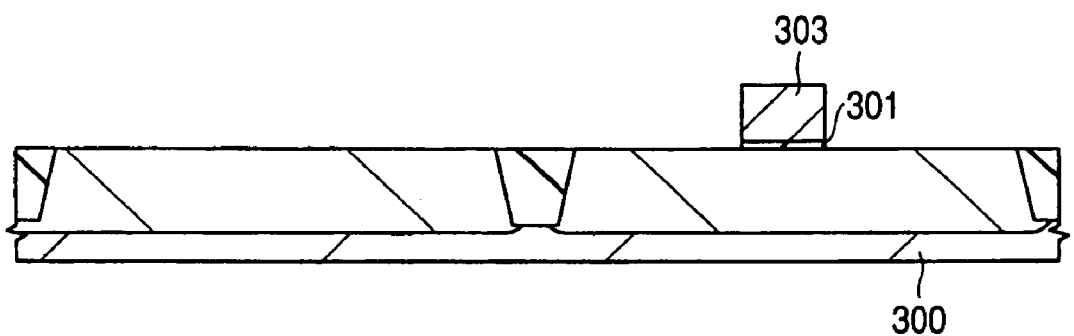
FIG. 45 is a cross-sectional view illustrating a manufacturing step of the semiconductor device following the step of FIG. 44.
Figure 46:
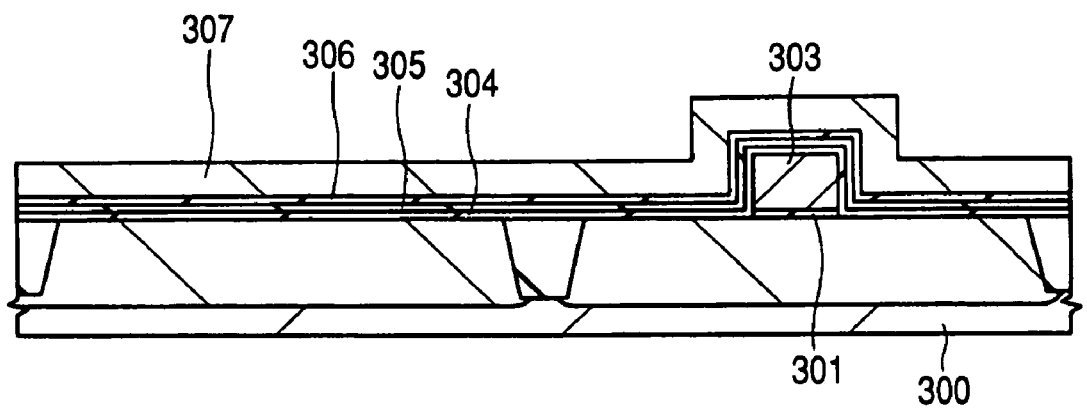
FIG. 46 is a cross-sectional view illustrating a manufacturing step of the semiconductor device following the step of FIG. 45.
Figure 47:
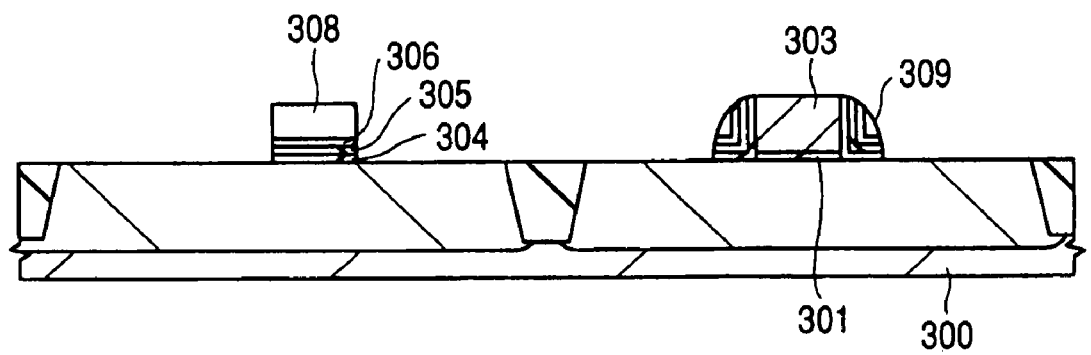
FIG. 47 is a cross-sectional view illustrating a manufacturing step of the semiconductor device following the step of FIG. 46.
Figure 48:
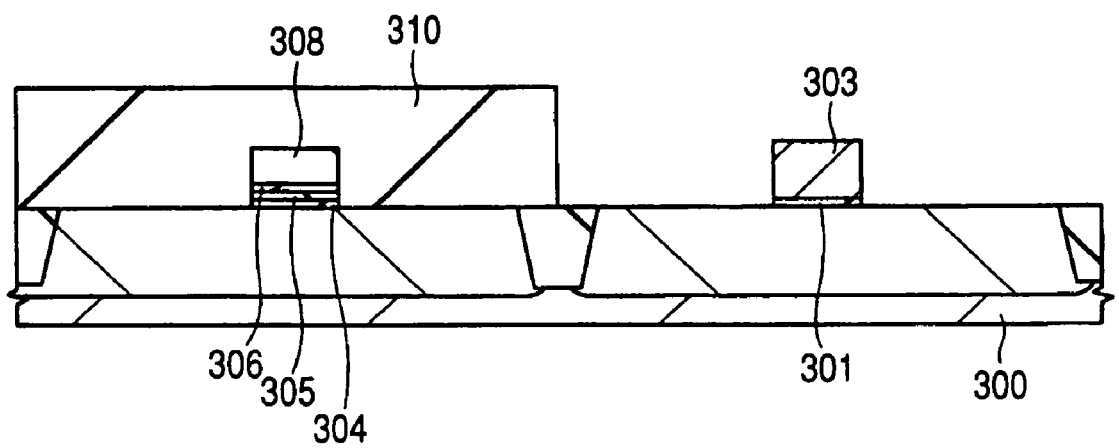
FIG. 48 is a cross-sectional view illustrating a manufacturing step of the semiconductor device following the step of FIG. 47.
Figure 49:
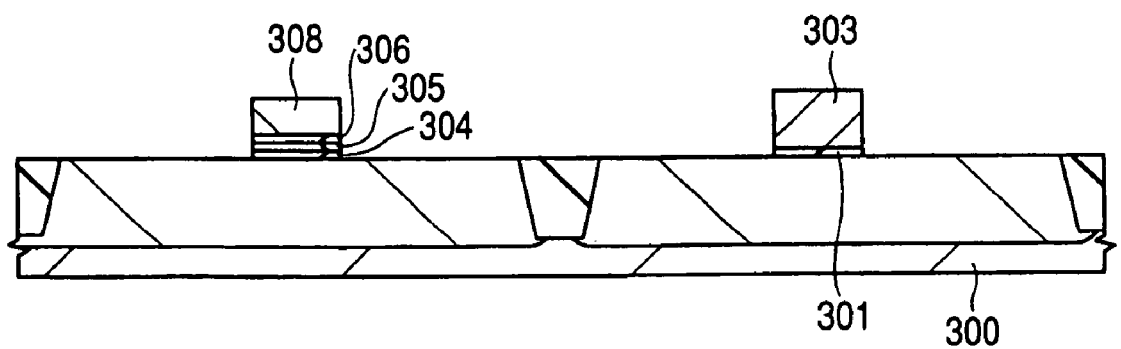
FIG. 49 is a cross-sectional view illustrating a manufacturing step of the semiconductor device following the step of FIG. 48.

A resist pattern for covering therewith the p channel MISFET formation region and boundary region and exposing therefrom the n channel MISFET formation region is then formed. At this time, in the n channel MISFET formation region, a hard mask made of the pattern 95 has been formed only over the gate electrode formation region. With this resist pattern as a mask and the pattern 95 as a hard mask, the gate electrode (first gate electrode) 96 is formed in the n channel MISFET formation region as illustrated in FIG. 37.

In such a manner, the gate electrode 96 made of a tantalum film is formed in the n channel MISFET formation region, while the gate electrode 93 made of a platinum film is formed in the p channel MISFET formation region. The dummy pattern 97 is formed in the boundary region.

In Embodiment 6, similar to Embodiment 1, prior to the fine processing for the formation of the gate electrode 96 of the n channel MISFET and gate electrode 93 of the p channel MISFET, gate electrode materials are formed and after completion of the formation of the two gate electrode materials, the fine processing for the formation of the gate electrodes 93 and 96 are performed. It is therefore possible to prevent generation of bird's beaks which will otherwise occur in the oxidation step for the formation of both the gate electrodes 93 and 96. As a result, the semiconductor device has improved reliability.

In this Embodiment, similar to Embodiments 2 and 4, the pattern 95 formed simultaneously with the gate electrode 93 is used as a hard mask for the formation of the gate electrode 96 so that misalignment between the gate electrodes 93 and 96 and contact holes 59 can be minimized, resulting in improved production yield of the semiconductor device.

In Embodiment 6, the tantalum film 90 is formed prior to the formation of the platinum film 92. Without limiting thereto, the platinum film 92 may be formed prior to the formation of the tantalum film 90.

It is also possible to form, in the second MISFET Q5 of Embodiment 5, the gate electrode of the n channel MISFET and the gate electrode of the p channel MISFET respectively as in Embodiment 6. In this case, respective advantages as described above are available.

The invention made by the present inventor was so far described specifically based on some Embodiments. It should however be borne in mind that the invention is not limited to or by them, but can be modified without departing from the scope of the invention.

The present invention can be used widely in the manufacturing industries of semiconductor devices.

What is claimed is:

1. A manufacturing method of a semiconductor device for forming a first MISFET over a first region of a semiconductor substrate and a second MISFET over a second region of the semiconductor substrate, which comprises the steps of:

(a) forming a first insulating film over the semiconductor substrate including the first region and the second region;
(b) forming a first conductor film over the first insulating film;
(c) removing the first conductor film and the first insulating film formed over the second region;
(d) after the step (c), forming a second insulating film over the semiconductor substrate including the second region and the first conductor film including the first region;
(e) forming a second conductor film over the second insulating film;
(f) patterning the second conductor film and the second insulating film to form a second gate electrode of the second MISFET in the second region; and
(g) after the step (f), patterning the first conductor film and the first insulating film formed in the first region to form a first gate electrode of the first MISFET in the first region.

2. A manufacturing method of a semiconductor device according to claim 1,
wherein the first region is a memory cell formation region, while the second region is a region other than the memory cell formation region.

3. A manufacturing method of a semiconductor device according to claim 1,
wherein the first region is a region other than a memory cell formation region and the second region is the memory cell formation region.

4. A manufacturing method of a semiconductor device according to claim 1,
wherein the first MISFET is an n channel MISFET, while the second MISFET is a p channel MISFET.

5. A manufacturing method of a semiconductor device according to claim 1,
wherein in the step (f), the second conductor film and the second insulating film are patterned to form a second gate electrode of the second MISFET in the second region and remove the second conductor film and the second insulating film from the first region.

6. A manufacturing method of a semiconductor device according to claim 1,
wherein in the step (f), the second conductor film and the second insulating film are patterned to form a second gate electrode of the second MISFET in the second region, and of the second conductor film and the second insulating film formed in the first region, remove the second conductor film and the second insulating film formed in a region other than the second electrode formation region of the first region while leaving the second conductor film and the second insulating film formed over the first gate electrode formation region of the first MISFET, and
wherein in the step (g), the first conductor film and the first insulating film are patterned with the second conductor film and the second insulating film formed over the first gate electrode formation region as a hard mask, whereby a first gate electrode of the first MISFET is formed in the first region.

7. A manufacturing method of a semiconductor device according to claim 1,
wherein a dummy pattern has been formed in the boundary region between the first region and the second region.

8. A manufacturing method of a semiconductor device according to claim 1,
wherein the first MISFET is a transistor constituting a nonvolatile memory cell.

9. A manufacturing method of a semiconductor device according to claim 8,
wherein the first insulating film is a film stack of a first potential barrier film, a charge storage film and a second potential barrier film.

10. A manufacturing method of a semiconductor device according to claim 9,
wherein the first potential barrier film and the second potential barrier film have been made of a silicon oxide film and the charge storage film has been made of a silicon nitride film.

11. A manufacturing method of a semiconductor device according to claim 1,
wherein the second MISFET is a transistor constituting a nonvolatile memory cell.

12. A manufacturing method of a semiconductor device according to claim 11,
wherein the second insulating film is a film stack of a first potential barrier film, a charge storage film and a second potential barrier film.

13. A manufacturing method of a semiconductor device according to claim 12,
wherein the first potential barrier film and the second potential barrier film have been made of a silicon oxide film, and the charge storage film has been made of a silicon nitride film.

14. A manufacturing method of a semiconductor device according to claim 1,
wherein the first insulating film and the second insulating film are different in film thickness.

15. A manufacturing method of a semiconductor device according to claim 14,
wherein the second insulating film has a smaller film thickness than the first insulating film.

16. A manufacturing method of a semiconductor device according to claim 15,
wherein the first conductor film has been made of a polysilicon film and the second conductor film has been made of a metal film.

17. A manufacturing method of a semiconductor device according to claim 1,
wherein the first conductor film and the second conductor film have been made of a metal film, the first MISFET is an n channel MISFET, and the second MISFET is a p channel MISFET.

18. A manufacturing method of a semiconductor device according to claim 1,
wherein the first conductor film and the second conductor film have been made of a metal film, the first MISFET is a p channel MISFET, and the second MISFET is an n channel MISFET.

19. A manufacturing method of a semiconductor device according to claim 17,
wherein the first insulating film and the second insulating film are each a high dielectric constant film having a higher dielectric constant than a silicon oxide film.

20. A manufacturing method of a semiconductor device according to claim 1, further comprising a step of forming a capacitor element having the first conductor film as a lower electrode and the second conductor film as an upper electrode in a third region of the semiconductor substrate.

21. A manufacturing method of a semiconductor device according to claim 18,
wherein the first insulating film and the second insulating film are each a high dielectric constant film having a higher dielectric constant than a silicon oxide film.

* * * * *